United States Patent
Peterson et al.

(10) Patent No.: US 12,386,261 B2
(45) Date of Patent: Aug. 12, 2025

(54) IN-RESIST PROCESS FOR HIGH DENSITY CONTACT FORMATION

(71) Applicant: Geminatio, Inc., Schenectady, NY (US)

(72) Inventors: Brennan Peterson, Longmont, CO (US); Phillip D. Hustad, Longmont, CO (US)

(73) Assignee: Geminatio, Inc., Schenectady, NY (US)

( * ) Notice: Subject to any disclaimer, the term of this patent is extended or adjusted under 35 U.S.C. 154(b) by 0 days.

(21) Appl. No.: 18/686,810

(22) PCT Filed: Aug. 25, 2022

(86) PCT No.: PCT/US2022/041533
§ 371 (c)(1),
(2) Date: Feb. 26, 2024

(87) PCT Pub. No.: WO2023/028236
PCT Pub. Date: Mar. 2, 2023

(65) Prior Publication Data
US 2025/0216784 A1    Jul. 3, 2025

Related U.S. Application Data

(60) Provisional application No. 63/236,832, filed on Aug. 25, 2021.

(51) Int. Cl.
*G03F 7/09* (2006.01)
*G03F 7/004* (2006.01)
(Continued)

(52) U.S. Cl.
CPC ............ *G03F 7/094* (2013.01); *G03F 7/0045* (2013.01); *G03F 7/0048* (2013.01); *G03F 7/039* (2013.01);
(Continued)

(58) Field of Classification Search
CPC ...... G03F 7/094; G03F 7/0045; G03F 7/0048; G03F 7/039; G03F 7/327; H01L 24/19
See application file for complete search history.

(56) References Cited

U.S. PATENT DOCUMENTS

| | | | |
|---|---|---|---|
| 8,431,325 B2 | 4/2013 | Hashimoto et al. | |
| 8,895,231 B2 * | 11/2014 | Hatakeyama | G03F 7/0035 430/312 |

(Continued)

OTHER PUBLICATIONS

Office Action issued in Japanese Application No. 2024-537795, mailed on Mar. 11, 2025 (5 pages).

(Continued)

*Primary Examiner* — Mohammad M Choudhry
(74) *Attorney, Agent, or Firm* — OSHA BERGMAN WATANABE & BURTON LLP

(57) ABSTRACT

A method of microfabrication includes forming a first relief pattern on a target layer of a substrate, coating the first relief pattern with a first solubility-shifting agent, layering a first polymeric fill on the first relief pattern, and diffusing the first solubility-shifting agent into the first polymeric fill to provide a solubility-shifted region of the first polymeric fill. Then the method includes forming a second relief pattern over the first relief pattern, coating the second relief pattern with a second solubility-shifting agent, layering a second polymeric fill on the second relief pattern, and diffusing the second solubility-shifting into the second polymeric fill to provide a solubility-shifted region of the second polymeric fill. Finally, the solubility-shifted regions of the first polymeric fill and the second polymeric fill are developed and the target layer is etched.

20 Claims, 8 Drawing Sheets

(51) Int. Cl.
*G03F 7/039* (2006.01)
*G03F 7/32* (2006.01)
*H01L 23/00* (2006.01)

(52) U.S. Cl.
CPC .............. *G03F 7/327* (2013.01); *H01L 24/19* (2013.01); *H01L 2224/19* (2013.01)

(56) References Cited

U.S. PATENT DOCUMENTS

| | | | |
|---|---|---|---|
| 9,029,064 B2* | 5/2015 | Hatakeyama | G03F 7/11 430/270.1 |
| 9,405,200 B2* | 8/2016 | Nakamura | G03F 7/0045 |
| 10,025,187 B2* | 7/2018 | Nagahara | G03F 1/24 |
| 10,131,730 B2* | 11/2018 | Fujiwara | G03F 7/325 |
| 2008/0063985 A1 | 3/2008 | Jung et al. | |
| 2008/0199814 A1 | 8/2008 | Brzozowy et al. | |
| 2010/0330503 A1 | 12/2010 | Bae et al. | |
| 2015/0214070 A1 | 7/2015 | deVilliers | |
| 2015/0294878 A1 | 10/2015 | deVilliers | |
| 2016/0062232 A1 | 3/2016 | Hong et al. | |
| 2019/0318958 A1 | 10/2019 | Bristol et al. | |
| 2021/0088904 A1 | 3/2021 | Devilliers et al. | |

OTHER PUBLICATIONS

International Search Report issued in Application No. PCT/US2022/041533, mailed on Dec. 15, 2022 (3 pages).

Written Opinion issued in Application No. PCT/US2022/041533, mailed on Dec. 15, 2022 (5 pages).

* cited by examiner

IN-RESIST PROCESS FOR HIGH DENSITY CONTACT FORMATION

CROSS REFERENCE TO RELATED APPLICATIONS

This application is a national stage application claiming priority to International Application Serial No. PCT/US2022/041533, entitled In-Resist Process for High Density Contact Formation, filed Aug. 25, 2023, hereby incorporated herein by reference.

BACKGROUND

Multi-patterning is a term that describes using more than one lithography step to create a final pattern. Multi-patterning, in different forms, enables the production of advanced semiconductor devices. Patterning typically includes two fundamental steps. The first step includes using lithography to create a pattern using mask-based exposure of light followed by development of soluble regions. The second step includes transferring the pattern into an underlying material by directional or anisotropic etching. These two steps together may be referred to as patterning a device.

High-density contact arrays are a defining feature of dynamic access random memory (DRAM) and static random-access memory (SRAM) technology and are important for advanced logic. A conventional multi-patterning process can cross planes of sidewall spacers to form a contact array. However, sidewall spacer processing is relatively expensive and time consuming because of the vapor phase deposition and etching required.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to a method of microfabrication including providing a substrate having a target layer formed thereon, forming a first relief pattern on a substrate, coating the first relief pattern with a first solubility-shifting agent, and layering a first polymeric fill on the first relief pattern. Then, the method includes diffusing the first solubility-shifting agent a predetermined distance into the first polymeric fill to provide a solubility-shifted region of the first polymeric fill, wherein the solubility-shifted region of the first polymeric fill borders the first relief pattern and wherein the solubility-shifted region of the first polymeric fill is soluble in a first developer. A second relief pattern is then formed over the first relief pattern and coated with a second solubility-shifting agent. The method then includes layering a second polymeric fill on the second relief pattern and diffusing the second solubility-shifting a predetermined distance into the second polymeric fill to provide a solubility-shifted region of the second polymeric fill, wherein the solubility-shifted region of the second polymeric fill borders the second relief pattern and wherein the solubility-shifted region of the second polymeric fill is soluble in a second developer. Finally, the method includes developing the first polymeric fill and the second polymeric fill such that the solubility-shifted region of the first polymeric fill and the solubility-shifted region of the second polymeric fill are dissolved providing gaps between the first relief pattern, the first polymeric fill, the second relief pattern, and the second polymeric fill where a portion of the target layer is exposed, and etching the target layer using the first relief pattern, the first polymeric fill, the second relief pattern, and the second polymeric fill as a combined etch mask.

In another aspect, embodiments disclosed herein relate to a method of microfabrication including providing a substrate having a target layer formed thereon, forming a first relief pattern on the substrate, coating the first relief pattern with a first solubility-shifting agent, layering a first polymeric fill on the first relief pattern, and diffusing the first solubility-shifting agent a predetermined distance into the first polymeric fill to provide a solubility-shifted region of the first polymeric fill, wherein the solubility-shifted region of the first polymeric fill borders the first relief pattern. Then, the method includes developing the first polymeric fill such that the solubility-shifted region of the first polymeric fill is dissolved, providing gaps between the first relief pattern and the first polymeric fill where a portion of the target layer is exposed and etching the target layer using the first relief pattern and the first polymeric fill as a combined etch mask. The method then includes forming a second relief pattern on the substrate, coating the second relief pattern with a second solubility-shifting agent, layering a second polymeric fill on the second relief pattern, and diffusing the second solubility-shifting a predetermined distance into the second polymeric fill to provide a solubility-shifted region of the second polymeric fill, wherein the solubility-shifted region of the second polymeric fill borders the second relief pattern. Finally, the method includes developing the second polymeric fill such that the solubility-shifted region of the second polymeric fill is dissolved providing gaps between the second relief pattern and the second polymeric fill where a portion of the target layer is exposed and etching the target layer of the substrate using the second relief pattern and the second polymeric fill as a combined etch mask.

In one or more of the above embodiments, the first relief pattern comprises features separated by gaps between the features, wherein the features comprise the first resist.

In one or more of the above embodiments, the first polymeric fill fills the gaps of the first relief pattern.

In one or more of the above embodiments, the second relief pattern comprises features separated by gaps between the features, wherein the features comprise the second resist.

In one or more of the above embodiments, the second polymeric fill fills the gaps of the second relief pattern.

In one or more of the above embodiments, etching the substrate comprises performing an anisotropic etch.

In one or more of the above embodiments, providing the first relief pattern on the target layer comprises: forming a first pattern of lines on the target layer; depositing a layer of the first resist over the first pattern of lines; exposing the first resist to a pattern of actinic radiation and developing the first resist such that the first relief pattern is formed over the first pattern of lines.

In one or more of the above embodiments, the first solubility-shifting agent comprises an acid generator. In one or more of the above embodiments, the acid generator is free of fluorine. In one or more of the above embodiments, the acid generator is selected from the group consisting of triphenylsulfonium antimonate, pyridinium perfluorobutane sulfonate, 3-fluoropyridinium perfluorobutanesulfonate, 4-t-butylphenyltetramethylenesulfonium perfluoro-1-butane-sulfonate, 4-t-butylphenyltetramethylenesulfonium 2-trifluoromethylbenzenesulfonate, 4-t- butylphenyltetramethylenesulfonium 4,4,5,5,6,6-hexafluorodihydro-4H-1,3,2-dithiazine 1,1,3,3-tetraoxide, and combinations thereof.

In one or more of the above embodiments, the first solubility-shifting agent comprises an acid. In one or more of the above embodiments, the acid is free of fluorine. In one or more of the above embodiments, the acid is selected from the group consisting of trifluoromethanesulfonic acid, perfluoro-1-butanesulfonic acid, p-toluenesulfonic acid, 4-dodecylbenzenesulfonic acid, 2,4-dinitrobenzenesulfonic acid, 2-trifluoromethylbenzenesulfonic acid, and combinations thereof.

In one or more of the above embodiments, the first solubility-shifting agent comprises a matrix polymer comprising monomers with ethylenically unsaturated polymerizable double bonds, including (meth)acrylate monomers; (meth)acrylic acids; vinyl aromatic monomers such as styrene, hydroxystyrene, vinyl naphthalene, and acenaphthylene; vinyl alcohol; vinyl chloride; vinyl pyrrolidone; vinyl pyridine; vinyl amine; vinyl acetal; maleic anhydride; maleimides; norbornenes; and combinations thereof.

In one or more of the above embodiments, the second solubility-shifting agent comprises an acid generator. In one or more of the above embodiments, the acid generator is free of fluorine. In one or more of the above embodiments, the acid generator is selected from the group consisting of triphenylsulfonium antimonate, pyridinium perfluorobutane sulfonate, 3-fluoropyridinium perfluorobutanesulfonate, 4-t-butylphenyltetramethylenesulfonium perfluoro-1-butanesulfonate, 4-t-butylphenyltetramethylenesulfonium 2-trifluoromethylbenzenesulfonate, 4-t-butylphenyltetramethylenesulfonium 4,4,5,5,6,6-hexafluorodihydro-4H-1,3,2-dithiazine 1,1,3,3-tetraoxide, and combinations thereof.

In one or more of the above embodiments, the second solubility-shifting agent comprises an acid. In one or more of the above embodiments, the acid is free of fluorine. In one or more of the above embodiments, the acid is selected from the group consisting of trifluoromethanesulfonic acid, perfluoro-1-butanesulfonic acid, p-toluenesulfonic acid, 4-dodecylbenzenesulfonic acid, 2,4-dinitrobenzenesulfonic acid, 2-trifluoromethylbenzenesulfonic acid, and combinations thereof.

In one or more of the above embodiments, the second solubility-shifting agent comprises a matrix polymer comprising monomers with ethylenically unsaturated polymerizable double bonds, including (meth)acrylate monomers; (meth)acrylic acids; vinyl aromatic monomers such as styrene, hydroxystyrene, vinyl naphthalene, and acenaphthylene; vinyl alcohol; vinyl chloride; vinyl pyrrolidone; vinyl pyridine; vinyl amine; vinyl acetal; maleic anhydride; maleimides; norbornenes; and combinations thereof.

In one or more of the above embodiments, the first resist is a positive tone developed resist and the first polymeric fill comprises a polymer that is soluble in a polar solvent.

In one or more of the above embodiments, the first resist is a negative tone developed resist and the first polymeric fill comprises a polymer that is soluble in a nonpolar organic solvent.

In one or more of the above embodiments, the first solubility-shifting agent comprises a solvent. In one or more of the above embodiments, the solvent is selected from the group consisting of methyl isobutyl carbinol (MIBC), decane, isoobutyl isobutyrate, isoamyl ether, and combinations thereof. In one or more of the above embodiments, the first resist is insoluble in the solvent.

In one or more of the above embodiments, the first resist comprises a polymer made from monomers selected from the group consisting of styrene, p-hydroxystyrene, methacrylate, norbornene, and combinations thereof.

In one or more of the above embodiments, the first polymeric fill comprises a polymer made from monomers selected from the group consisting of styrene, p-hydroxystyrene, methacrylate, norbornene, and combinations thereof.

In one or more of the above embodiments, the second resist is a positive tone developed resist and the second polymeric fill comprises a polymer that is soluble in a polar solvent.

In one or more of the above embodiments, the second resist is a negative tone developed resist and the second polymeric fill comprises a polymer that is soluble in a nonpolar organic solvent.

In one or more of the above embodiments, the second solubility-shifting agent comprises a solvent. In one or more of the above embodiments, the solvent is selected from the group consisting of methyl isobutyl carbinol (MIBC), decane, isoobutyl isobutyrate, isoamyl ether, and combinations thereof.

In one or more of the above embodiments, the second resist comprises a polymer made from monomers selected from the group consisting of styrene, p-hydroxystyrene, methacrylate, norbornene, and combinations thereof.

In one or more of the above embodiments, the second polymeric fill comprises a polymer made from monomers selected from the group consisting of styrene, p-hydroxystyrene, methacrylate, norbornene, and combinations thereof.

In one or more of the above embodiments, a specific developer is tetramethylammonium hydroxide.

In one or more of the above embodiments, a specific developer is a nonpolar organic solvent selected from the group consisting of n-butyl acetate (NBA), 2-heptanone, and combinations thereof.

Other aspects and advantages of the claimed subject matter will be apparent from the following description and the appended claims.

DETAILED DESCRIPTION

Figure 1:
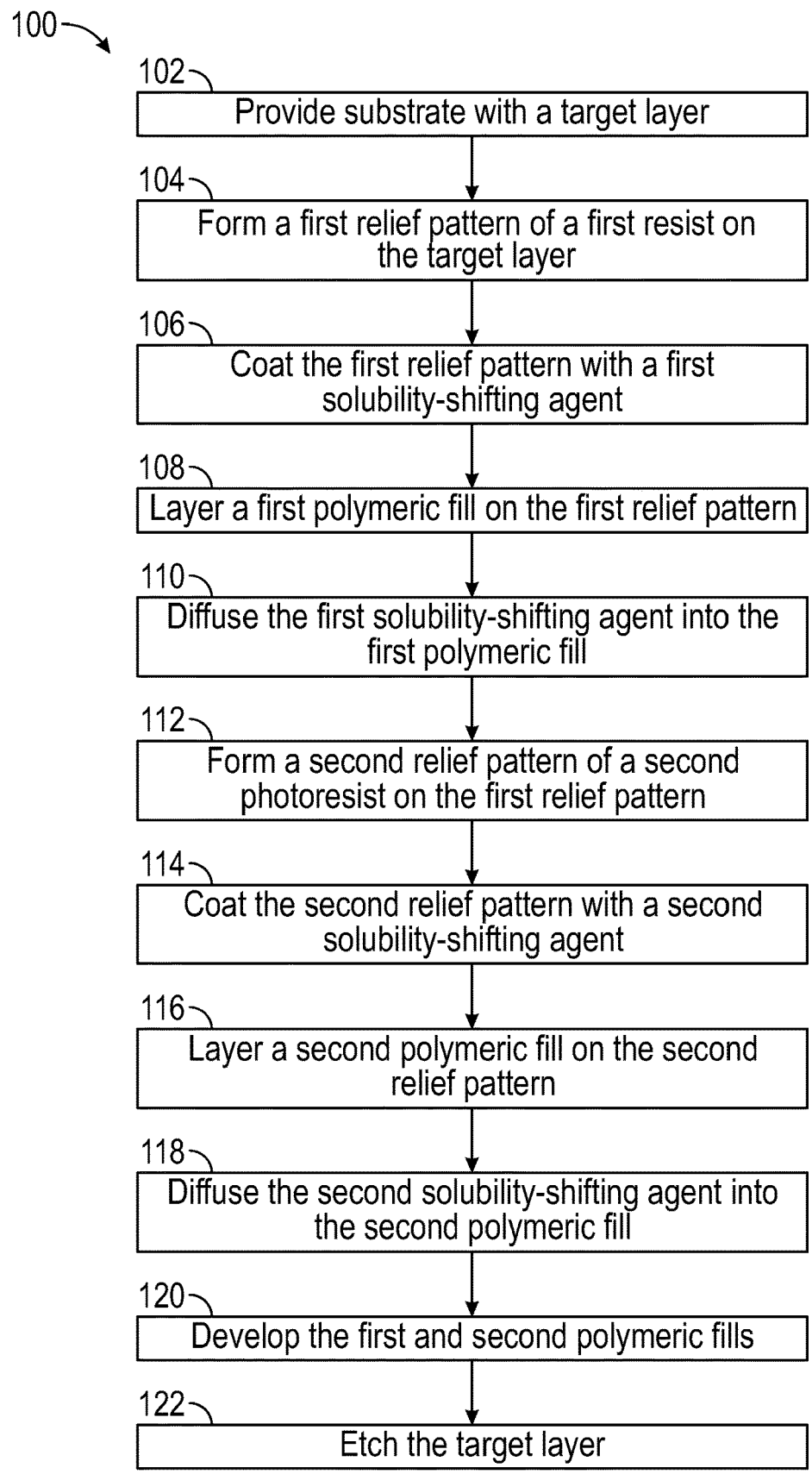
FIG. 1 is a block-flow diagram of a method in accordance with one or more embodiments of the present disclosure.

The present disclosure generally relates to a method of multi-patterning a semiconductor substrate. In one or more embodiments, the method includes forming a complex pattern such as a high-density array of holes or openings on a substrate. Herein, the terms "semiconductor substrate" and "substrate" are used interchangeably, and may be any semiconductor material including, but not limited to, semiconductor wafers, semiconductor material layers, and combinations thereof. The method may include cutting a complex pattern directly onto a substrate.

Methods disclosed herein obviate the need for sidewall spacers by crossing two planes of anti-spacer patterns to define contact arrays. Generally, an anti-spacer process is in in-track process (i.e., is performed in a coater-developer tool) that creates spacers by use of chemical process diffusion, using a single exposure. In methods according to the present disclosure, two to three anti-spacer processes may be used to create a high-density contact array. Such methods may advantageously create extremely small contacts at much lower cost and at a guaranteed size.

A method 100, in which two anti-spacer processes are applied to pattern a substrate, in accordance with the present disclosure is shown in, and discussed with reference to, FIG. 1. Initially, method 100 includes providing a substrate with a target layer formed thereon at block 102. Then, at block 104, a first relief pattern may be formed on the target layer. The first relief pattern may be formed using a photolithographic process and may be made of a first resist. At block 106, the first relief pattern is coated with a first solubility shifting agent. In particular embodiments, the first solubility-shifting agent is formulated with the first resist. When the solubility-shifting agent is formulated with the first resist, a solubility-shifting agent that is a thermal acid generator may be added to the first resist that has a higher activation temperature than the temperature of processing the resist in the absence of the thermal acid generator, so that the solubility-shifting agent may be activated after the photolithographic process forming the first relief pattern. The generated acid may diffuse out of the first resist to shift solubility of the second resist. Then, at block 108, a first polymeric fill is layered on the substrate, such that any exposed portion of the target layer is covered with the first polymeric fill. Layering of the first polymeric fill may also be referred to as "planarizing" the substrate, as this step may provide a flat layer on top of the substrate. At block 110, the first solubility-shifting agent is then diffused into the first polymeric fill, providing a solubility-shifting region of the first polymer fill that is soluble in a first developer.

At block 112 of method 100, a second relief pattern may be formed over the first relief pattern and the first polymeric fill. The second relief pattern may be formed using a photolithographic process and may be made of a second resist. In one or more embodiments, the second relief pattern is formed orthogonally to the first relief pattern. At block 114, the second relief pattern is coated with a second solubility-shifting agent. Then, at block 116, a second polymeric fill is layered on the second relief pattern such that any gaps in the second relief pattern that expose the first relief pattern, the first polymeric fill, or the target layer are filled. At block 118, the second solubility shifting agent is diffused into the second polymeric fill, providing a solubility-shifted region of the second polymeric fill that is soluble in a second developer. At block 120, the first and second polymeric fills are developed. At block 122, after developing the upper plane, the target layer may be etched to form a pattern of a high-density contact array.

Schematic depictions of a coated substrate at various points during the method described above are shown in FIGS. 2A-2I. Herein a "coated substrate" refers to a substrate that is coated with one or more layers, such as a first resist layer and a first polymeric fill layer. FIG. 2A shows a substrate including a target layer and a first relief pattern. FIG. 2B shows a substrate including a first relief pattern coated with a first solubility-shifting agent. In FIG. 2C, a first polymeric fill is layered over the target layer and the first relief pattern. FIG. 2D shows a coated substrate in which the first polymeric fill has a solubility-shifted region, provided by diffusion of the solubility-shifting agent into the first polymeric fill. Switching now to a top view, FIG. 2E shows a second relief pattern layered on the first polymeric fill, and FIG. 2F shows the second relief pattern coated with a second solubility-shifting agent. In FIG. 2G, a second polymeric fill is layered over the second relief pattern. FIG. 2H shows a coated substrate after the second solubility-shifting agent has been diffused into the second polymeric fill, providing the second polymeric fill with a solubility-shifted region. Finally, FIG. 2I shows a coated substrate after the solubility-shifted region of the first and second polymeric fills have been developed, such that portions of the target layer are exposed and able to be etched. The method of FIG. 1 and coated substrates shown in FIGS. 2A-2I are discussed in detail below.

At block 102 of method 100, a target layer is provided on a substrate. The target layer may be any target or memorization layer known in the art. In one or more particular embodiments, the target layer is a hardmask layer.

Then, at block 104, a first relief pattern is provided. FIG. 2A shows an example of a first relief pattern 204 on a target layer 202 of a substrate 201. A shown in FIG. 2A, the first relief pattern may include features separated by gaps. Portions of the substrate may be exposed by the presence of the gaps of the first relief pattern. The features of the first relief pattern may be made of a first resist 203. The first resist may be a photoresist. Generally, a photoresist is a chemically amplified photosensitive composition that comprises a polymer, a photoacid generator, and a solvent. In one or more embodiments, the first resist includes a polymer. The polymer may be any standard polymer typically used in resist material and may particularly be a polymer having acid-labile groups. For example, the polymer may be a polymer made from monomers including styrene, p-hydroxystyrene, acrylate, methacrylate, norbornene, and combinations thereof. Monomers that include reactive functional groups may be present in the polymer in a protected form. For example, the —OH group of p-hydroxystyrene may be protected with a tert-butyloxycarbonyl protecting group. Such protecting group may alter the reactivity and solubility of the polymer included in the first resist. As will be appreciated by one having ordinary skill in the art, various protecting groups may be used for this reason. Acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-decomposable groups", "acid-cleavable groups," "acid-cleavable protecting groups," "acid-labile protecting groups," "acid-leaving groups," and "acid-sensitive groups."

The acid-labile group which, on decomposition, forms a carboxylic acid on the polymer is preferably a tertiary ester group of the formula —C(O)OC($R^1$)$_3$ or an acetal group of the formula C(O)OC($R^2$)$_2$O$R^3$, wherein: $R^1$ is each independently linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably linear $C_{1-6}$ alkyl, branched $C_{3-6}$ alkyl, or monocyclic or polycyclic $C_{3-10}$ cycloalkyl, each of which is substituted or unsubstituted, each $R^1$ optionally including as part of its structure one or more groups chosen from —O—, C(O)—, C(O)—O—, or S—, and any two $R^1$ groups together optionally forming a ring; $R^2$ is independently hydrogen, fluorine, linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably hydrogen, linear $C_{1-6}$ alkyl, branched $C_{3-6}$ alkyl, or monocyclic or polycyclic $C_{3-10}$ cycloalkyl, each of which is substituted or unsubstituted, each $R^2$ optionally including as part of its structure one or more groups chosen from —O—, —C(O)—, —C(O)—O—, or —S—, and the $R^2$ groups together optionally forming a ring; and $R^3$ is linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably linear $C_{1-6}$ alkyl, branched $C_{3-6}$ alkyl, or monocyclic or polycyclic $C_{3-10}$ cycloalkyl, each of which is substituted or unsubstituted, $R^3$ optionally including as part of its structure one or more groups chosen from —O—, —C(O)—, C(O)—O—, or —S—, and one $R^2$ together with $R^3$ optionally forming a ring. Such monomer is typically a vinyl aromatic, (meth)acrylate, or norbornyl monomer. The total content of polymerized units comprising an acid-decomposable group which forms a carboxylic acid group on the polymer is typically from 10 to 100 mole %, more typically from 10 to 90 mole % or from 30 to 70 mole %, based on total polymerized units of the polymer.

The polymer can further include as polymerized a monomer comprising an acid-labile group, the decomposition of which group forms an alcohol group or a fluoroalcohol group on the polymer. Suitable such groups include, for example, an acetal group of the formula —COC($R^2$)$_2$O$R^3$—, or a carbonate ester group of the formula —OC(O)O—, wherein R is as defined above. Such monomer is typically a vinyl aromatic, (meth)acrylate, or norbornyl monomer. If present in the polymer, the total content of polymerized units comprising an acid-decomposable group, the decomposition of which group forms an alcohol group or a fluoroalcohol group on the polymer, is typically from 10 to 90 mole %, more typically from 30 to 70 mole %, based on total polymerized units of the polymer.

In embodiments in which the first resist is a photoresist, the first resist includes a photoacid generator. The photoacid generator is a compound capable of generating an acid upon irradiation with actinic rays or radiation. The photoacid generator may be selected from known compounds capable of generating an acid upon irradiation with actinic rays or radiation which are used for a photoinitiator for cationic photopolymerization, a photoinitiator for radical photopolymerization, a photodecoloring agent for dyes, a photodiscoloring agent, a microresist, or the like, and a mixture thereof can be used. Examples of the photoacid generator include a diazonium salt, a phosphonium salt, a sulfonium salt, an iodonium salt, imidosulfonate, oxime sulfonate, diazodisulfone, disulfone, and o-nitrobenzyl sulfonate.

Suitable photoacids include onium salts, for example, triphenylsulfonium trifhioromethanesulfonate, (p-tert-butoxyphenyl)diphenylsulfonium trifhioromethanesulfonate, tris(p-tert-butoxyphenyl)sulfonium trifluoromethanesulfonate, triphenylsulfonium p-toluenesulfonate; di-t-butyphenyliodonium perfluorobutanesulfonate, and di-t-butyphenyliodonium camphorsulfonate. Non-ionic sulfonates and sulfonyl compounds are also known to function as photoacid generators, e.g., nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable non-polymerizedphotoacid generators are further described in U.S. Pat. No. 8,431,325 to Hashimoto et al. in column 37, lines 11-47 and columns 41-91. Other suitable sulfonate PAGs include sulfonated esters and sulfonyloxy ketones, nitrobenzyl esters, s-triazine derivatives, benzoin tosylate, t-butylphenyl α-(p-toluenesulfonyloxy)-acetate, and t-butyl α-(p-toluenesulfonyloxy)-acetate; as described in U.S. Pat. Nos. 4,189,323 and 8,431,325. PAGs that are onium salts typically comprise an anion having a sulfonate group or a non-sulfonate type group, such as a sulfonamidate group, a sulfonimidate group, a methide group, or a borate group.

The resist composition may optionally comprise a plurality of PAGs. The plural PAGs may be polymeric, non-polymeric, or may include both polymeric and non-polymeric PAGs. Preferably, each of the plurality of PAGs is non-polymeric. Preferably, when a plurality of PAGs are used, a first PAG comprises a sulfonate group on the anion and a second PAG comprises an anion that is free of sulfonate groups, such anion containing for example, a sulfonamidate group, a sulfonimidate group, a methide group, or a borate group such as described above.

The first relief pattern may be formed by layering the first resist onto a substrate and then developing the first resist. The first resist may be developed according to procedures known in the art, e.g., by exposure to actinic radiation followed by rinsing with a first resist developer. In order to impart a shape, or relief pattern, in the developed resist, a mask may be used to block a portion of the resist from the actinic radiation. After the actinic radiation is applied, the unexposed portion of the resist may have a different solubility than the exposed portion of the resist. Subsequent rinsing with the first resist developer will dissolve either the unexposed portion or the exposed portion. A relief pattern provided when the unexposed portion of the resist remains after rinsing with a developer is a positive tone developed resist. In contrast, a relief pattern provided when the exposed portion of the resist remains after rinsing with a developer is a negative tone developed resist.

In one or more embodiments, the first resist is a positive tone developed (PTD) resist. In such embodiments, the first relief pattern may include a polymer made from the above described monomers, wherein any monomers including a reactive functional group are protected. As such, a PTD first resist may be organic soluble, and thus the relief pattern may be provided by rinsing with a first resist developer that is basic. Suitable basic first resist developers include quaternary ammonium hydroxides such as tetramethylammonium hydroxide (TMAH).

Alternatively, in one or more embodiments, the first resist is a negative resist. In such embodiments, the first relief pattern may include a polymer made from the above described monomers, wherein any monomers including a reactive functional group are not protected. Exposure to actinic radiation results in crosslinking of the polymer in areas of exposure, rendering the polymer insoluble to developers. The unexposed and thus uncrosslinked areas can then be removed using an appropriate developer to form the relief pattern.

In other embodiments, the first resist is a negative tone developed (NTD) resist. Similar to PTD resists, NTD resists may include a polymer made from the above described monomers, wherein any monomers including a reactive functional group are protected. As such, a NTD first resist may be organic soluble, but instead of developing the exposed areas with a first resist developer that is basic, the first relief pattern may be provided by rinsing the first resist with a first resist developer including an organic solvent. Suitable organic solvents that may be used as a first resist developer include n-butyl acetate (NBA) and 2-heptanone. The tone of the resist (i.e., PTD vs. negative vs. NTD) may influence the subsequent chemistry applied to the first relief pattern. In one or more embodiments, an NTD resist is advantageous as compared to a PTD resist. The resist may be selected to be soluble in a solvent that doesn't dissolve the underlying pattern.

In other embodiments, the first resist optionally contains other additives, wherein other additives include at least one of a resin having at least either a fluorine atom or a silicon atom, a basic compound, a surfactant, an onium carboxylate, dye, a plasticizer, a photosensitizer, a light absorbent, an alkali-soluble resin, a dissolution inhibitor, and a compound for accelerating dissolution in a developer.

As previously described, the first relief pattern may include features separated by gaps. In one or more embodiments, the features of the first relief pattern may have a thickness of about 300 to about 3000 Å. The gaps separating the features may leave portions of the substrate exposed.

In some embodiments, the first relief pattern is stabilized prior to coating with the solubility-shifting agent. Various resist stabilization techniques, also known as freeze processes, have been proposed such as ion implantation, UV curing, thermal hardening, thermal curing and chemical curing. Techniques are described, for example, in US2008/0063985A1, US 2008/0199814A1 and US 2010/0330503A1.

At block 106 of method 100, the first relief pattern is coated with a first solubility-shifting agent. A coated substrate in accordance with block 106 is shown in FIG. 2B. The first solubility-shifting agent 205 is shown as a thin coating over the first relief pattern 204. The thickness of the first solubility-shifting agent coating is not particularly limited and may be altered based on the desired high-density contact array pattern. The first solubility-shifting agent may be absorbed into the first resist. The process of absorbing the solubility-shifting agent into the first resist is described further below. Alternatively, the first solubility-shifting agent may be incorporated into the first resist of the first relief pattern. In such embodiments, no coating is necessary, and the first solubility-shifting agent may be dispersed uniformly throughout the first resist.

As noted above, in one or more embodiments, the first solubility-shifting agent is absorbed into the first relief pattern. Absorption of the first solubility-shifting agent into the first relief pattern may be achieved by performing a thermal pretreatment such as a bake. The bake may be a soft bake. The temperature and time of the soft bake may depend on the identity of the first resist, and the desired amount of diffusion of the solubility-shifting agent into the first resist. Typically, a soft bake may be performed for about 30 to 90 seconds at a temperature ranging from about 50° C. to about 150° C.

Alternatively, in one or more embodiments, the first solubility-shifting agent is formulated within the first resist. In such embodiments, the solubility-shifting agent may be included in the first resist in an inactive form, such that it does not alter the solubility of the first resist. The first solubility-shifting agent could then be activated, later on in method 100, to activate and elicit the desired solubility change in the desired material.

The composition of the first solubility-shifting agent may depend on the tone of the first resist. Generally, the first solubility-shifting agent may be any chemical that activates with light or heat. For example, when the first resist is a PTD resist, the first solubility-shifting agent may include an acid or thermal acid generator (TAG). The acid or generated acid in the case of a TAG should be sufficient with heat to cause cleavage of the bonds of acid-decomposable groups of the polymer in a surface region of the first resist pattern to cause increased solubility of the first resist polymer in a specific developer to be applied. The acid or TAG is typically present in the composition in an amount of from about 0.01 to 20 wt % based on the total solids of the trimming composition.

Preferable acids are organic acids including non-aromatic acids and aromatic acids, each of which can optionally have fluorine substitution. Suitable organic acids include, for example: carboxylic acids such as alkanoic acids, including formic acid, acetic acid, propionic acid, butyric acid, dichloroacetic acid, trichloroacetic acid, perfluoroacetic acid, perfluorooctanoic acid, oxalic acid malonic acid and succinic acid; hydroxyalkanoic acids, such as citric acid; aromatic carboxylic acids such as benzoic acid, fluorobenzoic acid, hydroxybenzoic acid and naphthoic acid; organic phosphorus acids such as dimethylphosphoric acid and dimethylphosphinic acid; and sulfonic acids such as optionally fluorinated alkylsulfonic acids including methanesulfonic acid, trifluoromethanesulfonic acid, ethanesulfonic acid, 1-butanesulfonic acid, 1-perfluorobutanesulfonic acid, 1,1,2,2-tetrafluorobutane-1-sulfonic acid, 1,1,2,2-tetrafluoro-4-hydroxybutane-1-sulfonic acid, 1-pentanesulfonic acid, 1-hexanesulfonic acid, and 1-heptanesulfonic acid.

Exemplary aromatic acids that are free of fluorine include wherein aromatic acids of the general formula (I):

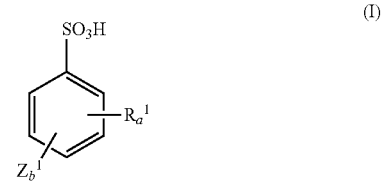

wherein: R1 independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; Z1 independently represents a group chosen from carboxyl, hydroxy, nitro, cyano, C1 to C5 alkoxy, formyl and sulfonic acid; a and b are independently an integer from 0 to 5; and a +b is 5 or less.

Exemplary aromatic acids may be of the general formula (II):

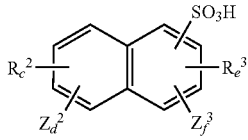

(II)

wherein: R2 and R3 each independently represents a substituted or unsubstituted C1-C20 alkyl group, a substituted or unsubstituted C5-C16 aryl group or a combination thereof, optionally containing one or more group chosen from carbonyl, carbonyloxy, sulfonamido, ether, thioether, a substituted or unsubstituted alkylene group, or a combination thereof; Z2 and Z3 each independently represents a group chosen from carboxyl, hydroxy, nitro, cyano, C1 to C5 alkoxy, formyl and sulfonic acid; c and d are independently an integer from 0 to 4; c+d is 4 or less; e and f are independently an integer from 0 to 3; and e+f is 3 or less.

Additional aromatic acids that may be included in the solubility-shifting agent include those the general formula (III) or (IV):

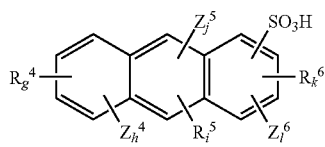

(III)

wherein: R4, R5 and R6 each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; Z4, Z5 and Z6 each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 2; i+j is 2 or less; k and 1 are independently an integer from 0 to 3; and k+l is 3 or less;

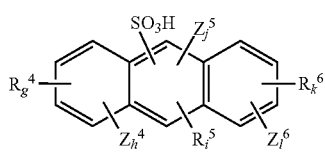

(IV)

wherein: R4, R5 and R6 each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; Z4, Z5 and Z6 each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 1; i+j is 1 or less; k and 1 are independently an integer from 0 to 4; and k+l is 4 or less.

Suitable aromatic acids may alternatively be of the general formula (V):

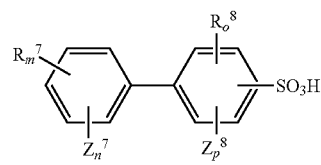

(V)

wherein: R7 and R8 each independently represents a substituted or unsubstituted C1-C20 alkyl group, a substituted or unsubstituted C5-C14 aryl group or a combination thereof, optionally containing one or more group chosen from carboxyl, carbonyl, carbonyloxy, sulfonamido, ether, thioether, a substituted or unsubstituted alkylene group, or a combination thereof; Z7 and Z8 each independently represents a group chosen from hydroxy, nitro, cyano, C1 to C5 alkoxy, formyl and sulfonic acid; m and n are independently an integer from 0 to 5; m+n is 5 or less; o and p are independently an integer from 0 to 4; and o+p is 4 or less.

Additionally, exemplary aromatic acids may have the general formula (VI):

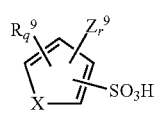

(VI)

wherein: X is O or S; R9 independently represents a substituted or unsubstituted $C_1$-$C_{20}$ alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; Z9 independently represents a group chosen from carboxyl, hydroxy, nitro, cyano, C1 to C5 alkoxy, formyl and sulfonic acid; q and r are independently an integer from 0 to 3; and q+r is 3 or less.

In one or more embodiments, the acid is a free acid having fluorine substitution. Suitable free acids having fluorine substitution may be aromatic or nonaromatic. For example, free acid having fluorine substitution that may be used as solubility-shifting agent include, but are not limited to the following:

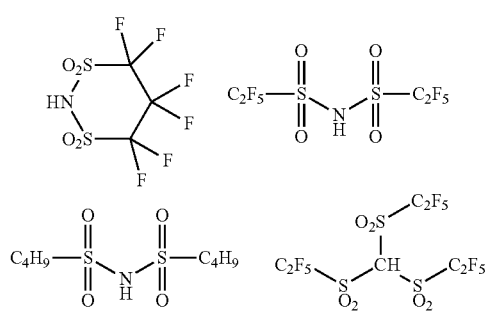

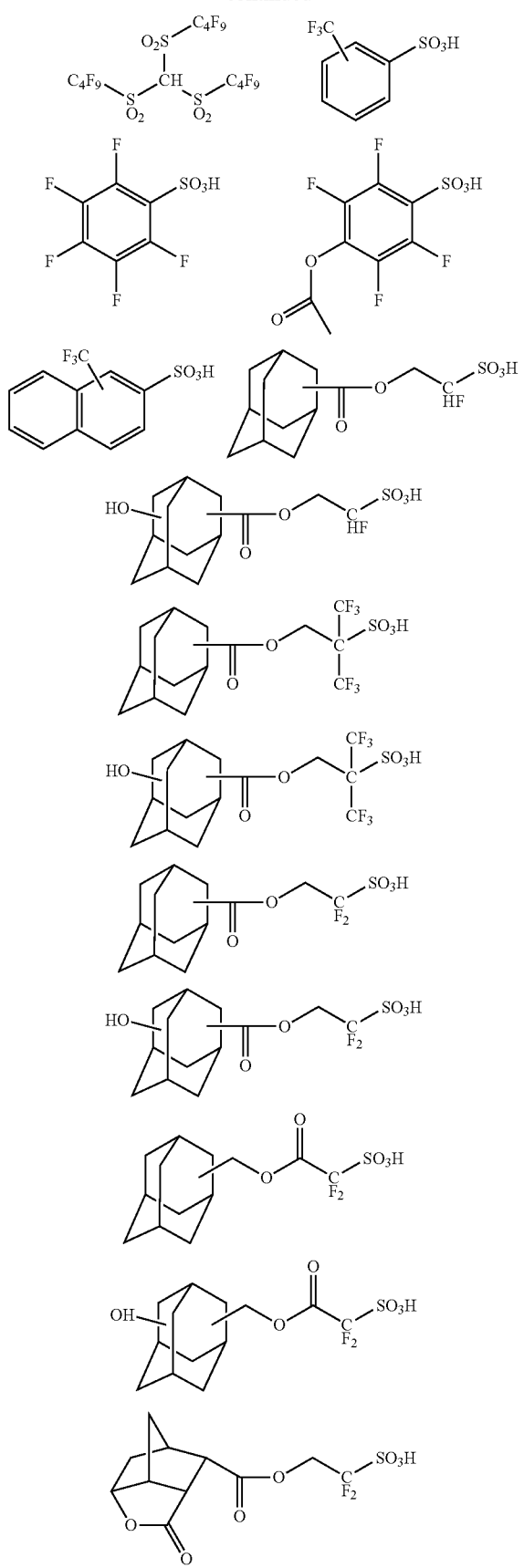
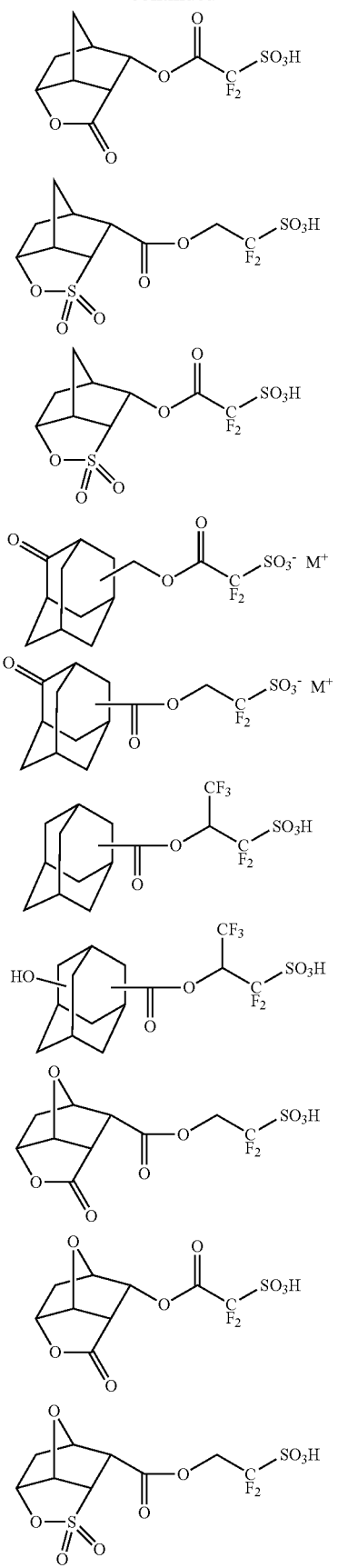

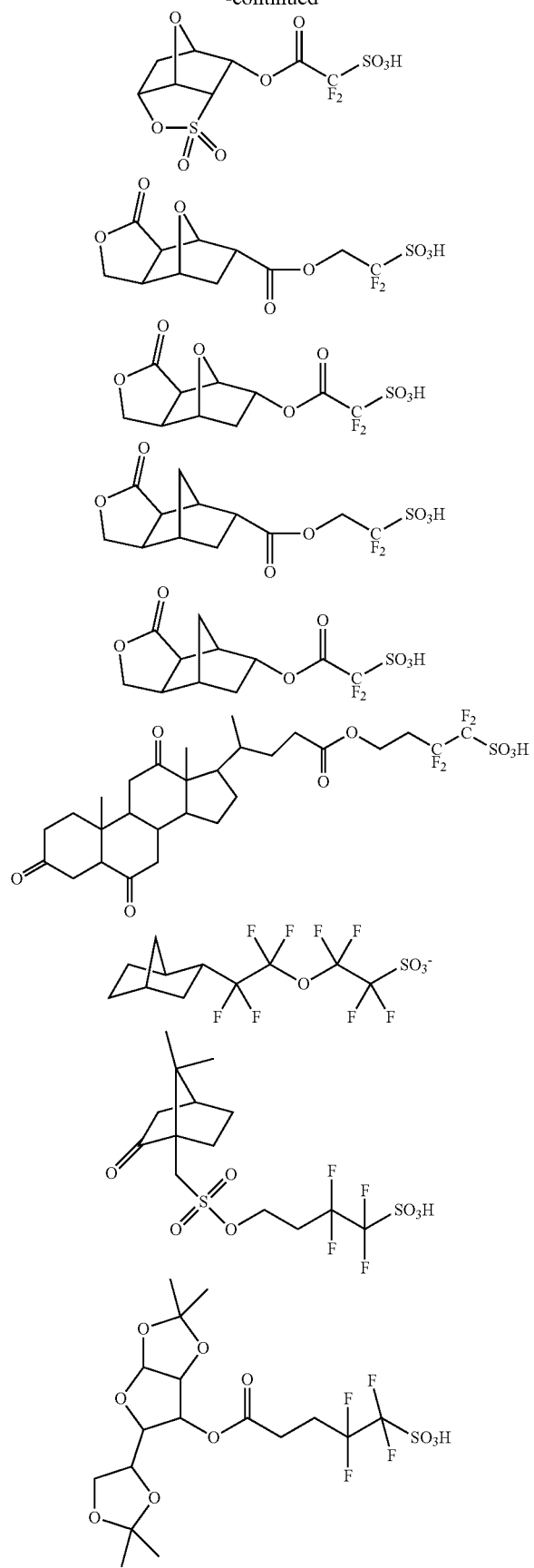
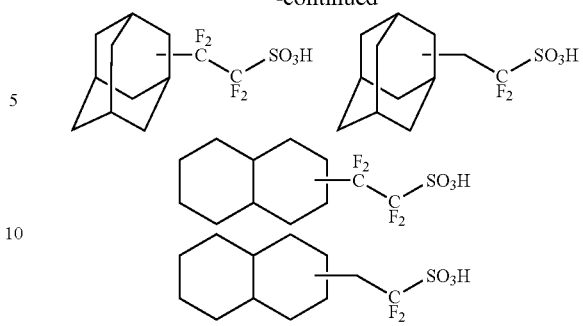

Suitable TAGs include those capable of generating a non-polymeric acid as described above. The TAG can be non-ionic or ionic. Suitable nonionic thermal acid generators include, for example, cyclohexyl trifluoromethyl sulfonate, methyl trifluoromethyl sulfonate, cyclohexyl p-toluenesulfonate, methyl p-toluenesulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof. Suitable ionic thermal acid generators include, for example, dodecylbenzenesulfonic acid triethylamine salts, dodecylbenzenedisulfonic acid triethylamine salts, p-toluene sulfonic acid-ammonium salts, p-toluene sulfonic acid-pyridinium salts, sulfonate salts, such as carbocyclic aryl and heteroaryl sulfonate salts, aliphatic sulfonate salts, and benzenesulfonate salts. Compounds that generate a sulfonic acid upon activation are generally suitable. Preferred thermal acid generators include p-toluenesulfonic acid ammonium salts, and heteroaryl sulfonate salts.

Preferably, the TAG is ionic with a reaction scheme for generation of a sulfonic acid as shown below:

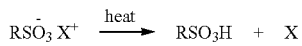

wherein $RSO_3^-$ is the TAG anion and $X^+$ is the TAG cation, preferably an organic cation. The cation can be a nitrogen-containing cation of the general formula (I):

which is the monoprotonated form of a nitrogen-containing base B. Suitable nitrogen-containing bases B include, for example: optionally substituted amines such as ammonia, difluoromethylammonia, C1-20 alkyl amines, and C3-30 aryl amines, for example, nitrogen-containing heteroaromatic bases such as pyridine or substituted pyridine (e.g., 3-fluoropyridine), pyrimidine and pyrazine; nitrogen-containing heterocyclic groups, for example, oxazole, oxazoline, or thiazoline. The foregoing nitrogen-containing bases B can be optionally substituted, for example, with one or more group chosen from alkyl, aryl, halogen atom (preferably fluorine), cyano, nitro and alkoxy. Of these, base B is preferably a heteroaromatic base.

Base B typically has a pKa from 0 to 5.0, or between 0 and 4.0, or between 0 and 3.0, or between 1.0 and 3.0. As used herein, the term "pKa" is used in accordance with its art-recognized meaning, that is, pKa is the negative log (to the base 10) of the dissociation constant of the conjugate acid (BH)$^+$ of the basic moiety (B) in aqueous solution at about room temperature. In certain embodiments, base B has a boiling point less than about 170° C., or less than about 160° C., 150° C., 140° C., 130° C., 120° C., 110° C., 100° C. or 90° C.

Exemplary suitable nitrogen-containing cations (BH)$^+$ include $NH_4^+$, $CF_2HNH_2^+$, $CF_3CH_2NH_3^+$, $(CH_3)_3NH^+$, $(C_2H_5)_3NH^+$, $(CH_3)_2(C_2H_5)NH^+$ and the following:

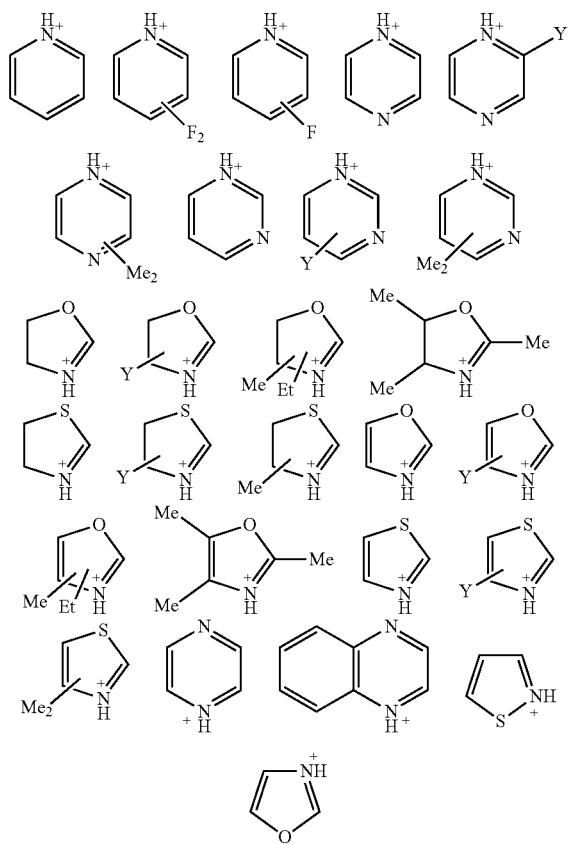

in which Y is alkyl, preferably, methyl or ethyl.

In particular embodiments, the solubility-shifting agent may be an acid such as trifluoromethanesulfonic acid, perfluoro-1-butanesulfonic acid, p-toluenesulfonic acid, 4-dodecylbenzenesulfonic acid, 2,4-dinitrobenzenesulfonic acid, and 2-trifluoromethylbenzenesulfonic acid; an acid generator such as triphenylsulfonium antimonate, pyridinium perfluorobutane sulfonate, 3-fluoropyridinium perfluorobutanesulfonate, 4-t-butylphenyltetramethylenesulfonium perfluoro-1-butanesulfonate, 4-t-butylphenyltetramethylenesulfonium 2-trifluoromethylbenzenesulfonate, and 4-t-butylphenyltetramethylenesulfonium 4,4,5,5,6,6-hexafluorodihydro-4H-1,3,2-dithiazine 1,1,3,3-tetraoxide; or a combination thereof.

Alternatively, when the first resist is an NTD resist, the first solubility-shifting agent may include a base or base generator. In such embodiments, suitable solubility-shifting agents include, but are not limited to, hydroxides, carboxylates, amines, imines, amides, and mixtures thereof. Specific examples of bases include ammonium carbonate, ammonium hydroxide, ammonium hydrogen phosphate, ammonium phosphate, tetramethylammonium carbonate, tetramethylammonium hydroxide, tetramethylammonium hydrogen phosphate, tetramethylammonium phosphate, tetraethylammonium carbonate, tetraethylammonium hydroxide, tetraethylammonium hydrogen phosphate, tetraethylammonium phosphate, and combinations thereof. Amines include aliphatic amines, cycloaliphatic amines, aromatic amines and heterocyclic amines. The amine may be a primary, secondary or tertiary amine. The amine may be a monoamine, diamine or polyamine. Suitable amines may include C1-30 organic amines, imines, or amides, or may be a C1-30 quaternary ammonium salt of a strong base (e.g., a hydroxide or alkoxide) or a weak base (e.g., a carboxylate). Exemplary bases include amines such as tripropylamine, dodecylamine, tris(2-hydroxypropyl)amine, tetrakis(2-hydroxypropyl)ethylenediamine; aryl amines such as diphenylamine, triphenylamine, aminophenol, and 2-(4-aminophenyl)-2-(4-hydroxyphenyl)propane, Troger's base, a hindered amine such as diazabicycloundecene (DBU) or diazabicyclononene (DBN), amides like tert-butyl 1,3-dihydroxy-2-(hydroxymethyl)propan-2-ylcarbamate and tert-butyl 4-hydroxypiperidine-1-carboxylateor; or ionic quenchers including quaternary alkyl ammonium salts such as tetrabutylammonium hydroxide (TBAH) or tetrabutylammonium lactate. In another embodiment, the amine is a hydroxyamine. Examples of hydroxyamines include hydroxyamines having one or more hydroxyalkyl groups each having 1 to about 8 carbon atoms, and preferably 1 to about 5 carbon atoms such as hydroxymethyl, hydroxyethyl and hydroxybutyl groups. Specific examples of hydroxyamines include mono-, di- and tri-ethanolamine, 3-amino-1-propanol, 2-amino-2-methyl-I-propanol, 2-amino-2-ethyl-1,3-propanediol, tris(hydroxymethyl)aminomethane, N-methylethanolamine, 2-diethylamino-2-methyl-I-propanol and triethanolamine.

Suitable base generators may be thermal base generators. A thermal base generator forms a base upon heating above a first temperature, typically about 140° C. or higher. The thermal base generator may include a functional group such as an amide, sulfonamide, imide, imine, O-acyl oxime, benzoyloxycarbonyl derivative, quarternary ammonium salt, nifedipine, carbamate, and combinations thereof. Exemplary thermal base generators include o-{(.beta.-(dimethylamino)ethyl)aminocarbonyl}benzoic acid, o-{(.gamma.-(dimethylamino)propyl)aminocarbonyl}benzoic acid, 2,5-bis{(.beta.-(dimethylamino)ethyl) aminocarbonyl}terephthalic acid, 2,5-bis{(.gamma.-(dimethylamino)propyl)aminocarbonyl}terephthalic acid, 2,4-bis{(.beta.-(dimethylamino)ethyl) aminocarbonyl}isophthalic acid, 2,4-bis{(.gamma.-(dimethylamino)propyl)aminocarbonyl}isophthalic acid, and combinations thereof.

In one or more embodiments, the first solubility-shifting agent includes a solvent. The solvent may be any suitable solvent provided that it does not dissolve the first resist. The solvent is typically chosen from water, organic solvents and mixtures thereof. In some embodiments, the solvent may include an organic-based solvent system comprising one or more organic solvents. The term "organic-based" means that the solvent system includes greater than 50 wt % organic solvent based on total solvents of the solubility-shifting agent composition, more typically greater than 90 wt %, greater than 95 wt %, greater than 99 wt % or 100 wt % organic solvents, based on total solvents of the solubility-shifting agent compositions. The solvent component is typically present in an amount of from 90 to 99 wt % based on the solubility-shifting agent composition.

Suitable organic solvents for the solubility-shifting agent composition include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; alcohols such as straight, branched or cyclic C4-C9 monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and C5-C9 fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; ethers such as isopentyl ether and dipropylene glycol monomethyl ether; and mixtures containing one or more of these solvents.

The solvent included in the absorbed material may depend on the composition and tone of the first resist. When the first resist is formed from a (meth)acrylate polymer, as is typical for ArF resists and the resist is developed as a PTD resist, the solvent system preferably comprises one or more polar organic solvents. For example, a solubility-shifting agent meant to be absorbed into a PTD first photoresist may include a polar solvent such as methyl isobutyl carbinol (MIBC). The solubility-shifting agent may also include aliphatic hydrocarbons, esters, and ethers as cosolvents, such as decane, isobutyl isobutyrate, isoamyl ether, and combinations thereof. In particular embodiments, the solvent includes MIBC and a cosolvent. In such embodiments, the MIBC may be included in the solvent in an amount ranging from 60 to 99%, based on the total volume of solvent. Accordingly, the cosolvent may be included in amount ranging from 1 to 40%, based on the total volume of solvent.

When the first resist is formed from a vinyl aromatic-based polymer, as is typical for KrF and EUV photoresists, and the resist is developed as a PTD resist, the solvent system preferably comprises one or more non-polar organic solvents. The term "non-polar organic-based" means that the solvent system includes greater than 50 wt % of combined non-polar organic solvents based on total solvents of the solubility-shifting agent composition, more typically greater than 70 wt %, greater than 85 wt % or 100 wt %, combined non-polar organic solvents, based on total solvents of the solubility-shifting agent composition. The non-polar organic solvents are typically present in the solvent system in a combined amount of from 70 to 98 wt %, preferably 80 to 95 wt %, more preferably from 85 to 98 wt %, based on the solvent system.

Suitable non-polar solvents include, for example, ethers, hydrocarbons, and combinations thereof, with ethers being preferred. Suitable ether solvents include, for example, alkyl monoethers and aromatic monoethers, particularly preferred of which are those having a total carbon number of from 6 to 16. Suitable alkyl monoethers include, for example, 1,4-cineole, 1,8-cineole, pinene oxide, di-n-propyl ether, diisopropyl ether, di-n-butyl ether, di-n-pentyl ether, diisoamyl ether, dihexyl ether, diheptyl ether, and dioctyl ether, with diisoamyl ether being preferred. Suitable aromatic monoethers include, for example, anisole, ethylbenzyl ether, diphenyl ether, dibenzyl ether and phenetole, with anisole being preferred. Suitable aliphatic hydrocarbons include, for example, n-heptane, 2-methylheptane, 3-methylheptane, 3,3-dimethylhexane, 2,3,4-trimethylpentane, n-octane, n-nonane, n-decane, and fluorinated compounds such as perfluoroheptane. Suitable aromatic hydrocarbons include, for example, benzene, toluene, and xylene.

In some embodiments, the solvent system further includes one or more alcohol and/or ester solvents. For certain compositions, an alcohol and/or ester solvent may provide enhanced solubility with respect to the solid components of the composition. Suitable alcohol solvents include, for example: straight, branched or cyclic C4-9 monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol, 4-octanol, 2,2,3,3,4,4-hexafluoro-1-butanol, 2,2,3,3,4,4,5,5-octafluoro-1-pentanol, and 2,2,3,3,4,4,5,5,6,6-decafluoro-1-hexanol; and C5-9 fluorinated diols such as 2,2,3,3,4,4-hexafluoro-1,5-pentanediol, 2,2,3,3,4,4,5,5-octafluoro-1,6-hexanediol, and 2,2,3,3,4,4,5,5,6,6,7,7-dodecafluoro-1,8-octanediol. The alcohol solvent is preferably a C4-9 monohydric alcohol, with 4-methyl-2-pentanol being preferred. Suitable ester solvents include, for example, alkyl esters having a total carbon number of from 4 to 10, for example, alkyl propionates such as n-butyl propionate, n-pentyl propionate, n-hexyl propionate, and n-heptyl propionate, and alkyl butyrates such as n-butyl butyrate, isobutyl butyrate, and isobutyl isobutyrate. The one or more alcohol and/or ester solvents if used in the solvent system are typically present in a combined amount of from 2 to 50 wt %, more typically in an amount of from 2 to 30 wt %, based on the solvent system.

The solvent system can also include one or more additional solvents chosen, for example, from one or more of: ketones such as 2,5-dimethyl-4-hexanone and 2,6-dimethyl-4-heptanone; and polyethers such as dipropylene glycol monomethyl ether and tripropylene glycol monomethyl ether. Such additional solvents, if used, are typically present in a combined amount of from 1 to 20 wt % based on the solvent system.

When the first resist is formed from a vinyl aromatic-based polymer, a particularly preferred organic-based solvent system includes one or more monoether solvents in a combined amount of from 70 to 98 wt % based on the solvent system, and one or more alcohol and/or ester solvents in a combined amount of from 2 to 30 wt % based on the solvent system. The solvent system is typically present in the overcoat composition in an amount of from 90 to 99 wt %, preferably from 95 to 99 wt %, based on the overcoat composition.

As described above, in one or more embodiments, the first solubility-shifting agent is coated over the first relief pattern. To properly coat the first relief pattern, the first solubility-shifting agent may include a matrix polymer. Any matrix polymer commonly used in the art may be included in the first solubility-shifting material. The matrix polymer should have good solubility in a solvent that does not dissolve the first resist. The matrix polymer can be formed from one or more monomers chosen, for example, from those having an ethylenically unsaturated polymerizable double bond, such as: (meth)acrylate monomers such as isopropyl(meth)acrylate and n-butyl(meth)acrylate; (meth)acrylic acid; vinyl aromatic monomers such as styrene, hydroxystyrene, vinyl naphthalene and acenaphthylene; vinyl alcohol; vinyl chloride; vinyl pyrrolidone; vinyl pyridine; vinyl amine; vinyl acetal; maleic anhydride; maleimides; norbornenes; and combinations thereof.

In some embodiments, the polymer contains one or more functional groups chosen, for example, from hydroxy, acid groups such as carboxyl, sulfonic acid and sulfonamide, silanol, fluoroalcohol such as hexafluoroisopropyl alcohol [—C(CF3)2OH], anhydrates, lactones, esters, ethers, allylamine, pyrrolidones and combinations thereof. The polymer can be a homopolymer or a copolymer having a plurality of distinct repeat units, for example, two, three, four or more distinct repeat units. In one aspect, the repeat units of the polymer are all formed from (meth)acrylate monomers, are all formed from (vinyl)aromatic monomers or are all formed from (meth)acrylate monomers and (vinyl) aromatic monomers. When the polymer includes more than one type of repeat unit, it typically takes the form of a random copolymer.

In particular embodiments, the matrix polymer may be a t-butyl acrylate (TBA)/p-hydroxystyrene (PHS) copolymer, a butyl acrylate (BA)/PHS copolymer, a TBA/methacrylic acid (MAA) copolymer, a BA/MAA copolymer, a PHS/methacrylate (MA) copolymer, and combinations thereof.

The solubility-shifting agent compositions typically include a single polymer but can optionally include one or more additional polymers. The content of the polymer in the composition will depend, for example, on the target thickness of the layer, with a higher polymer content being used when thicker layer is desired. The polymer is typically present in the pattern solubility-shifting agent composition in an amount of from 80 to 99.9 wt %, more typically from 90 to 99 wt %, or 95 to 99 wt %, based on total solids of the solubility-shifting agent composition. The weight average molecular weight (Mw) of the polymer is typically less than 400,000, preferably from 3000 to 50,000, more preferably from 3000 to 25,000, as measured by GPC versus polystyrene standards. Typically, the polymer will have a polydispersity index (PDI=Mw/Mn) of 3 or less, preferably 2 or less, as measured by GPC versus polystyrene standards.

Suitable polymers for use in the solubility-shifting agent compositions are commercially available and/or can readily be made by persons skilled in the art. For example, the polymer may be synthesized by dissolving selected monomers corresponding to units of the polymer in an organic solvent, adding a radical polymerization initiator thereto, and effecting heat polymerization to form the polymer. Examples of suitable organic solvents that can be used for polymerization of the polymer include, for example, toluene, benzene, tetrahydrofuran, diethyl ether, dioxane, ethyl lactate and methyl isobutyl carbinol. Suitable polymerization initiators include, for example, 2,2'-azobisisobutyronitrile (AIBN), 2,2'-azobis(2,4-dimethylvaleronitrile), dimethyl 2,2-azobis(2-methylpropionate), benzoyl peroxide and lauroyl peroxide.

Solubility-shifting agents including a matrix polymer may be coated over the first relief pattern according to methods known in the art. Typically, a solubility-shifting agent that includes a matrix polymer may coated over the first relief pattern by spin coating. The solids content of the first solubility-agent may be tailored to provide a film of a desired thickness of the first solubility-shifting agent over the first relief pattern. For example, the solids content of the first solubility-shifting agent solution can be adjusted to provide a desired film thickness based upon the specific coating equipment utilized, the viscosity of the solution, the speed of the coating tool and the amount of time allowed for spinning. A typical thickness for the composition is from about 200 Å to about 1500 Å.

In one or more embodiments, a first solubility-shifting agent includes an active material (i.e., and acid, acid generator, base, or base generator), a solvent, and a matrix polymer as previously described. A typical formulation for such solubility-shifting agent may include about 1 to 10 wt % solids and 90 to 99 wt % solvent, based on the total weight of the solubility shifting agent, where the solids include the active material and the matrix polymer. Within the solids content, the active material may be included in an amount ranging from about 1 to about 5 wt %.

The first solubility-shifting agent may include additives having various purposes, depending on the particular chemistry being used. In some embodiments, a surfactant may be included in the solubility-shifting agent. A surfactant may be included in the solubility-shifting agent to help with coating quality, especially when needing to fill thin gaps between features of the first resist. Any suitable surfactant known in the art may be included in the solubility-shifting agent.

After absorption into the first relief pattern, a coating layer that does not include any active solubility-shifting material, may remain on the first resist. In one or more embodiments, the coating layer may be removed by a rinse. The rinse may be accomplished by rinsing the coated substrate with a solvent that dissolves the coating layer but does not dissolve the first resist. The rinse may be carried out using any suitable method, for example, by dipping a substrate in a bath filled with the solvent for a fixed time (dip method), by raising the solvent on a substrate surface by the effect of a surface tension and keeping it still for a fixed time, thereby dissolving the coating layer (puddle method), by spraying the solvent on a substrate surface (spray method), or by continuously ejecting the solvent on a substrate rotating at a constant speed while scanning the solvent ejecting nozzle at a constant rate (dynamic dispense method).

At block 108 of method 100, a first polymeric fill is deposited on the substrate. A coated substrate layered with a first relief pattern 204, a first solubility-shifting agent 205, and a first polymeric fill 206 is shown in FIG. 2C. The first polymeric fill may be deposited on the substrate such that it fills gaps of the first relief pattern and the first polymeric fill may be in contact with the first relief pattern or the first solubility-shifting agent. In depositing the first polymeric fill in such fashion, a planar layer should exist on the substrate and target layer, as shown in FIG. 2C. In some embodiments, the first polymeric fill completely covers the target layer, the first relief pattern, and the first solubility-shifting agent. The first polymeric fill may be deposited on the substrate according to any suitable method known in the art such as, for example, spin-on deposition or vapor-phase treatment.

In one or more embodiments, the first polymeric fill includes a resist. In such embodiments, the resist may be a PTD, negative, or NTD resist, as previously described. The resist included in the first polymeric fill may include a polymer. Suitable polymers may be as previously described with respect to the polymer defined as the first resist polymer and/or the matrix polymer. In particular embodiments, suitable polymers may be made from monomers including p-hydroxystryene, styrene, t-butyl acrylate, and combinations thereof. In particular embodiments, the polymer is made from all three of p-hydroxystyrene, styrene, and t-butylacrylate. Such polymer may be prepared from a polymerization reaction including from about 50% to about 80% p-hydroxystyrene, from about 10 to about 30% styrene, and from about 10% to about 30% t-butylacrylate. For example, a polymerization reaction to produce a polymer included in the first polymeric fill may include p-hdroxystyrene in an amount ranging from a lower limit of one of about 50%, about 55%, about 60%, and about 65% to an upper limit of one of about 65%, about 70%, about 75%, and about 80%, where any lower limit may be paired with any mathematically compatible upper limit, and styrene and t-butyl acrylate in individual amounts ranging from a lower limit of one of about 10%, about 12%, about 14%, about 16%, about 18%, and about 20% to an upper limit of one of about 20%, about 22%, about 24%, about 26%, about 28%, and about 30%, where any lower limit may be paired with any mathematically compatible upper limit.

The polymer included in the first polymeric fill may have a weight average molecular weight (Mw) ranging from 1 to 100 kg/mol. For example, in one or more embodiments, the first polymeric fill may include a polymer having a Mw ranging from a lower limit of one of 1, 2, 5, 10, 15, 20, and 25 kg/mol to an upper limit of one of 25, 50, 75, 80, 90, and 100 kg/mol, where any lower limit may be paired with any mathematically compatible upper limit. A polymer having such Mw may exhibit desired solubility characteristics, such as, in particular, the dissolution rate.

In one or more embodiments, the first polymeric fill includes a solvent. The solvent may be as previously described with respect to the solvent included in the first solubility-shifting agent. In particular embodiments, the solvent in the first polymeric fill is the same as the solvent in the first solubility-shifting agent.

The first polymeric fill may include additives having various purposes, depending on the particular chemistry being used. In some embodiments, a quencher is included in the first polymeric fill. A quencher may be included in the first polymeric fill to help control the diffusion of the active material in the solubility-shifting agent. Suitable quenchers include any of the bases previously listed with reference to the solubility-shifting material.

At block 110 of method 100 the first solubility-shifting agent is diffused into the first polymeric fill. The first solubility-shifting agent may be diffused according to a suitable diffusion method known in the art. Specific methods and conditions used, however, may depend on characteristics of the first solubility-shifting agent, such as, for example, activation temperature, diffusivity, among others. In one or more embodiments, diffusion of the first solubility-shifting agent into the first polymeric fill is achieved by performing a bake. The bake may be carried out with a hotplate or oven. The temperature and time of the bake may depend on the identity of the first polymeric fill and the desired amount of diffusion of the first solubility-shifting agent into the first polymeric fill. Suitable conditions for the bake may include a temperature ranging from 50 to 160° C., and a time ranging from about 30 to 90 seconds. In one or more embodiments, after the bake, a solubility-shifted region may be present around the edges of the first polymeric fill. The amount of diffusion of the first solubility-shifting agent may correspond to the thickness of the solubility-shifted region. In some embodiments, the solubility-shifted region extends into the first polymeric fill such that it has a thickness of about 5 to about 60 nm. For example, the thickness of the solubility-shifted region may range from a lower limit of one of about 5 nm, about 10 nm, about 15 nm, about 20 nm, and about 25 nm to an upper limit of one of about 40 nm, about 45 nm, about 50 nm, about 55 nm, and about 60 nm, where any lower limit may be paired with any mathematically compatible upper limit. In one or more embodiments, the thickness of the solubility-shifted region may correspond to the desired pattern of a high-density contact array that is to be cut into the target layer.

A coated substrate including a solubility-shifted region of the first polymeric fill is shown in FIG. 2D. As shown in FIG. 2D, the coated substrate includes a substrate 201 and a target layer 202. The substrate is as previously described. The first relief pattern 204, comprised of the first resist 203, is on top of the substrate 202. The first relief pattern 204 is coated with the first solubility-shifting agent. The first polymeric fill 206 is coated on the substrate such that it covers the target layer 201 and forms a planar layer with the first relief pattern 204. In alternate embodiments, the first polymeric fill completely covers the target layer and the first relief pattern. A solubility-shifted region 208 of the first polymeric fill is shown bordering the first relief pattern.

The solubility-shifted region may have a different solubility than the region of the first polymeric fill that was not exposed to the first solubility-shifting agent. As such, the solubility-shifted region and the unexposed region of the first polymeric fill may be soluble in different resist developers.

At block 112 of method 100, a second relief pattern 210 may be formed over the first relief pattern and the first polymeric film. Herein, the planar layer formed by the first polymeric film and the first relief pattern may be referred to as the "lower plane." A birds-eye view of a coated substrate including a lower plane and a second relief pattern is shown in FIG. 2E. As shown in FIG. 2E, the second relief pattern may be formed orthogonally to the first relief pattern. In one or more embodiments, the second relief pattern may have features separated by gaps, similar to the first relief pattern, and the features of the second relief pattern may be formed such that they cross the features of the first relief pattern. For example, if the first relief pattern is made of horizontal lines, the second relief pattern may be made of vertical lines so that the lines cross. In one or more embodiments, the features of the first and second relief patterns may cross at a 90° angle. In other embodiments, the features may cross at a 60° angle. As will be appreciated by a person of ordinary skill in the art, various angles of crossing may be used depending on the desired high-density contact array pattern.

In one or more embodiments, the features of the second relief pattern are formed photolithographically and are made of a second resist 211. The second resist may include a polymer. Suitable polymers that may be included in the second resist are as previously describer with reference to the first resist. The second resist may be a PTD or an NTD resist, as described with reference to the first resist. In one or more embodiments, the second resist is the same as the first resist. In order to form the second relief pattern without affecting the first relief pattern, a "freeze" may be applied to the first relief pattern. The freeze is a surface treatment that protects the first relief pattern and prevents it from dissolving into the second resist by maintaining the integrity of the boundaries of the features.

At block 114, the second relief pattern is coated with a second solubility-shifting agent. FIG. 2F shows a coated substrate including a lower plane and a second relief pattern coated with a second solubility-shifting agent 212. The second solubility-shifting agent may be similar to the first solubility-shifting agent, in so much as the components of the first solubility-shifting agent may also be included in the second solubility-shifting agent. In one or more embodiments, the second solubility-shifting agent includes an acid or acid generator and a matrix polymer as previously described. Additionally, similar to the first solubility-shifting agent, the second solubility-shifting agent may be absorbed into the second relief pattern. Alternatively, the second solubility-shifting agent may be formulated within the second resist, as described above with respect to the first solubility-shifting agent.

The second solubility-shifting agent may be coated over the second relief pattern by spin coating. The solids content of the second solubility-agent, as determined by the amount of matrix polymer included, may be tailored to provide a film of a desired thickness of the second solubility-shifting agent over the second relief pattern. For example, the solids content of the solubility-shifting agent solution can be adjusted to provide a desired film thickness based upon the specific coating equipment utilized, the viscosity of the solution, the speed of the coating tool and the amount of time allowed for spinning. A typical thickness for the composition is from about 200 Å to about 1500 Å.

As noted above, in one or more embodiments, the second solubility-shifting agent is absorbed into the second relief pattern. Absorption of the solubility-shifting agent into the first relief pattern may be achieved by performing a thermal pretreatment such as a bake. The bake may be a soft bake. The temperature and time of the soft bake may depend on the identity of the first resist, and the desired amount of diffusion of the solubility-shifting agent into the first resist. Typically, a soft bake may be performed for about 30 to 90 seconds at a temperature ranging from about 50° C. to about 150° C.

After absorption into the first relief pattern, a coating layer that does not include any active solubility-shifting material, may remain on the second resist. In one or more embodiments, the coating layer may be removed by a rinse. The rinse may be accomplished by rinsing the coated substrate with a solvent that dissolves the coating layer but does not dissolve the first resist. The rinse may be carried out using any suitable method, for example, by dipping a substrate in a bath filled with the solvent for a fixed time (dip method), by raising the solvent on a substrate surface by the effect of a surface tension and keeping it still for a fixed time, thereby dissolving the coating layer (puddle method), by spraying the solvent on a substrate surface (spray method), or by continuously ejecting the solvent on a substrate rotating at a constant speed while scanning the solvent ejecting nozzle at a constant rate (dynamic dispense method).

Then, at block 116 of method 100, a second polymeric film is layered on the second relief pattern. An example of a coated substrate at this point in the method is shown in FIG. 2G. As shown in FIG. 2G, the second polymeric fill 214 may be in contact with the second relief pattern or the second solubility-shifting agent and may fill any gaps in the second relief pattern that expose the lower plane. Similar to the deposition of the first polymeric film, deposition of the second polymeric film may provide a planarized layer on top of the lower plane. As previously described, such layer may be referred to as the upper plane.

In one or more embodiments, the second polymeric fill includes a resist including a polymer and a solvent, and one or more additives as previously described with respect to the first polymeric fill. In some embodiments, the second polymeric fill is the same as the first polymeric fill.

At block 118 of method 100, the second solubility-shifting agent is diffused into the second polymeric fill. In one or more embodiments, diffusion of the second solubility-shifting agent into the second polymeric fill is achieved by performing a bake. The bake may be a soft bake. As described above with reference to the first polymeric fill, the temperature and time of the soft bake may depend on the identity of the second polymeric fill and the desired amount of diffusion of the second solubility-shifting agent into the second polymeric fill.

After the soft bake, a solubility-shifted region may be present around the edges of the second polymeric fill. FIG. 2H shows a coated substrate after the second solubility-shifting agent has been diffused into the second polymeric fill, providing the second polymeric fill with a solubility-shifted region 216. The amount of diffusion of the second solubility-shifting agent may correspond to the thickness of the solubility-shifted region. In some embodiments, the solubility-shifted region extends into the second polymeric fill such that it has a thickness of about 5 to about 60 nm. For example, the thickness of the solubility-shifted region may range from a lower limit of one of 5, 10, 15, 20, and 25 nm to an upper limit of one of 40, 45, 50, 55, and 60 nm, where any lower limit may be paired with any mathematically compatible upper limit. In one or more embodiments, the thickness of the solubility-shifted region may correspond to the desired pattern of a high-density contact array that is to be cut into the target layer.

The solubility-shifted region may have a different solubility than the region of the second polymeric fill that was not exposed to the solubility-shifting agent. As such, the solubility-shifted region and the unexposed region of the second polymeric fill may be soluble in different resist developers.

At block 120 of method 100, the first and second polymeric fills may be developed using a specific developer such that the solubility-shifted regions of the second polymeric fill and the first polymeric fill are removed. Depending on resist of each of the first and second polymeric fills, development can include additional exposure to actinic radiation, thermal treatment, and development by a specific developer. In one or more embodiments, the first and second fills are developed by first being exposed to actinic radiation, and then being exposed to a specific developer. In other embodiments, the first and second polymeric fills are only exposed to the specific developer. The specific developer may depend on the tone of the resist present in the first and second polymeric fills. In particular embodiments, the first and second polymeric fills have the same solubility characteristics and are thus able to be developed with the same specific developer. For example, if the first and second polymeric fills include a positive tone developed resist, the specific developer may be a base such as tetramethylammonium hydroxide. On the other hand, if the first and second polymeric fills are a negative tone developed resist, the specific developer may be a nonpolar organic solvent, such as n-butyl acetate or 2-heptanone.

As described previously, the thickness of the solubility-shifted region may correspond to the desired pattern of high-density contact array to be cut into the target layer. FIG. 2I shows a coated substrate that has been developed according to embodiments of the present disclosure. In one or more embodiments, the first and second polymeric fills, 206 and 214, respectively, are developed so as to dissolve the solubility-shifted regions, which are formed on the borders of the first and second relief patterns. The result is a crossed pattern of very narrow trenches, which, when combined, define sub-resolution contact openings 220 that expose the target layer 202. Thus, block 122 of method 100, referring back to FIG. 1, includes etching the exposed portions of the target layer using the first relief pattern, the first polymeric fills, the second relief pattern, and the second polymeric fill as a combined etch mask 222. Such method may provide a high-density contact array on a target layer. The etch process may be an isotropic or anisotropic etch process, using any suitable dry etchant, such as CF, O, HBr, or F. In one embodiment, the etchant can be a dry etchant such as CF, O, HBr, and F.

Figure 2A:
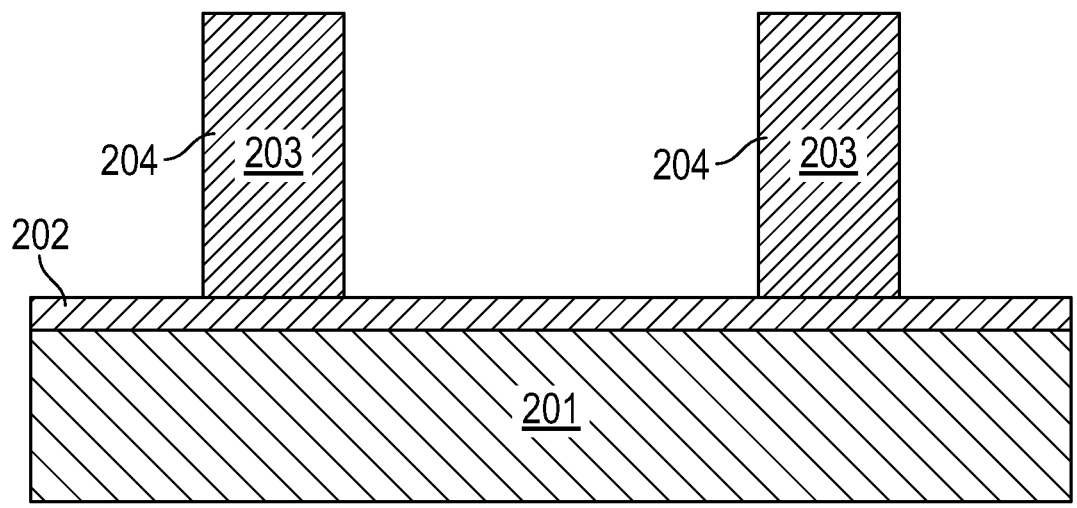
FIGS. 2A-2I are schematic illustrations of coated substrates at respective points of a method in accordance with one or more embodiments the present disclosure.
Figure 2B:
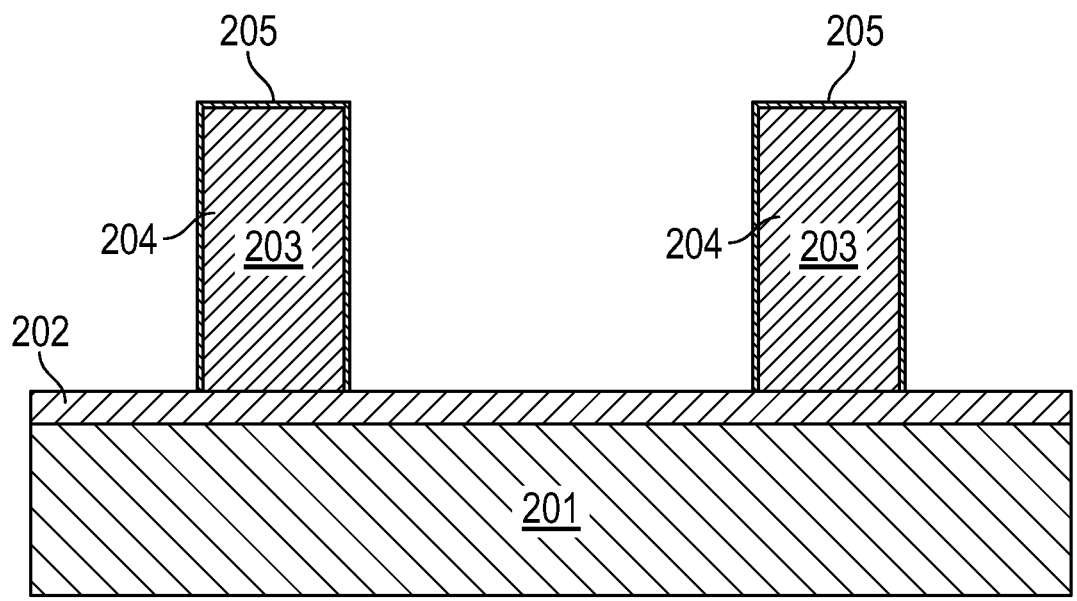
Figure 2C:
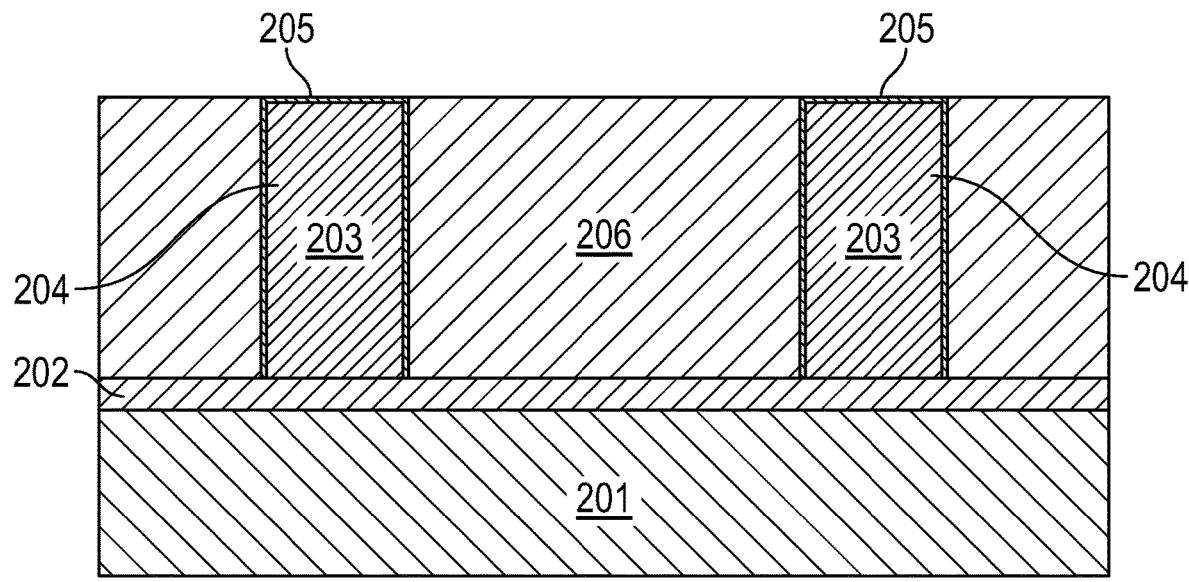
Figure 2D:
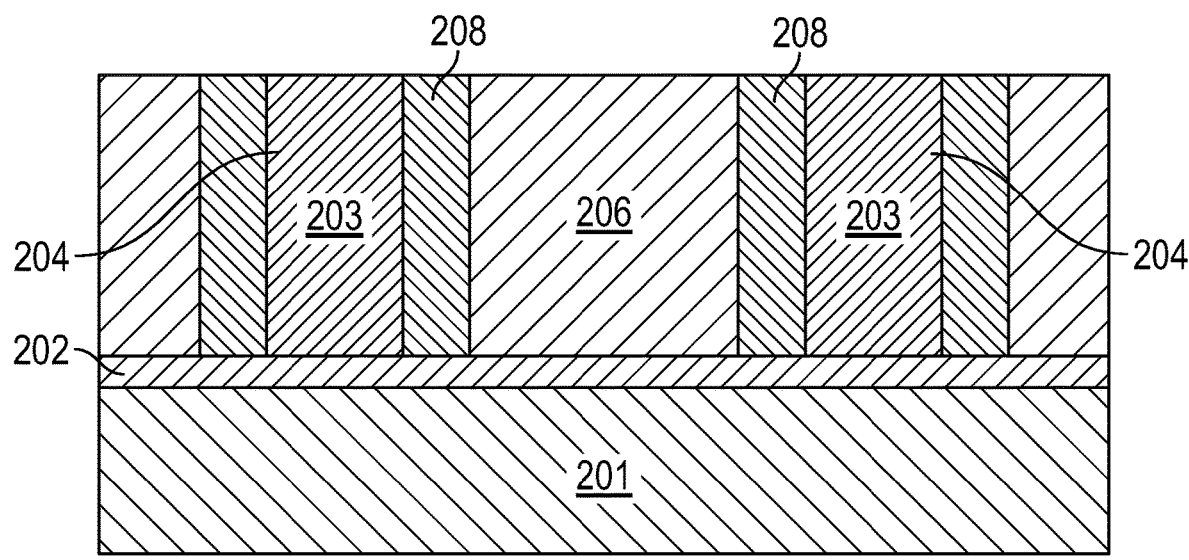
Figure 2E:
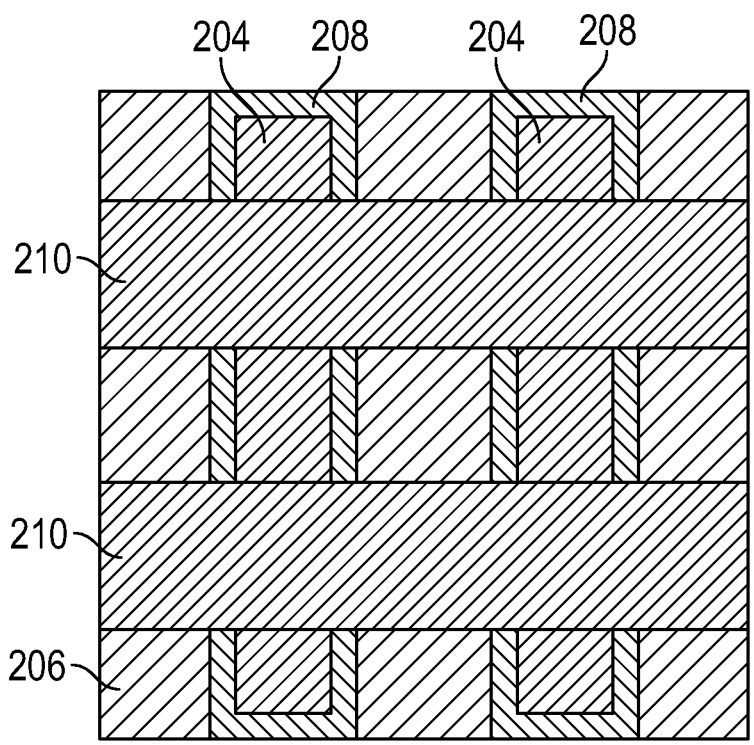
Figure 2F:
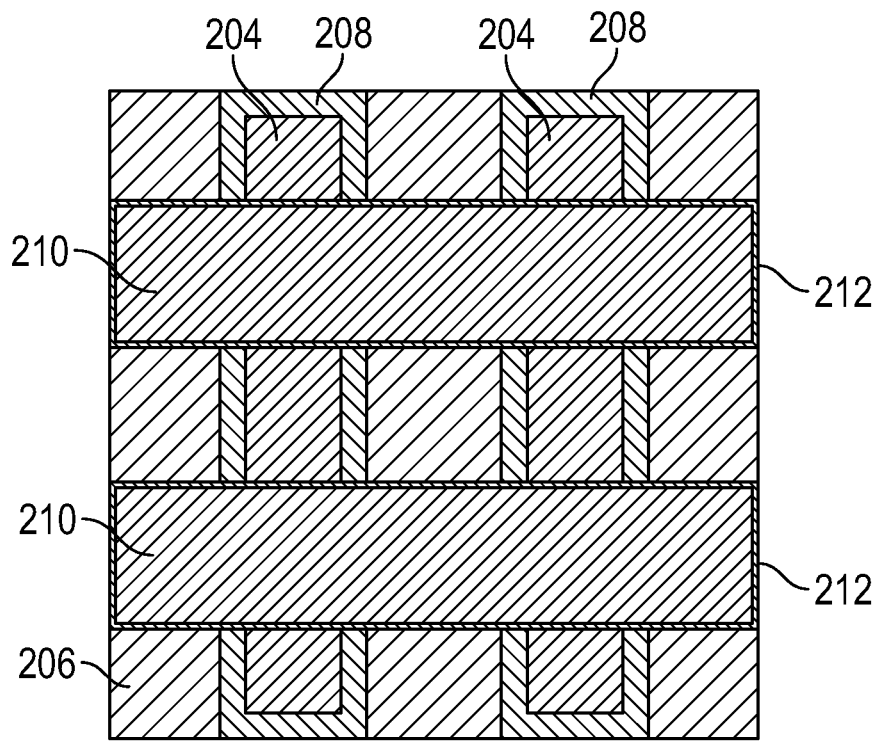
Figure 2G:
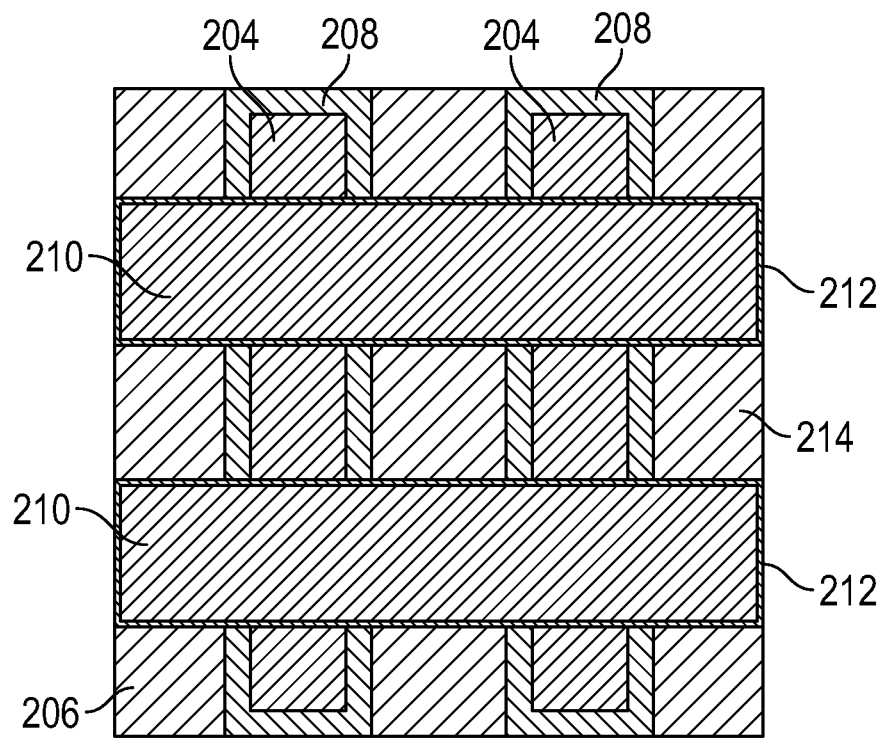
Figure 2H:
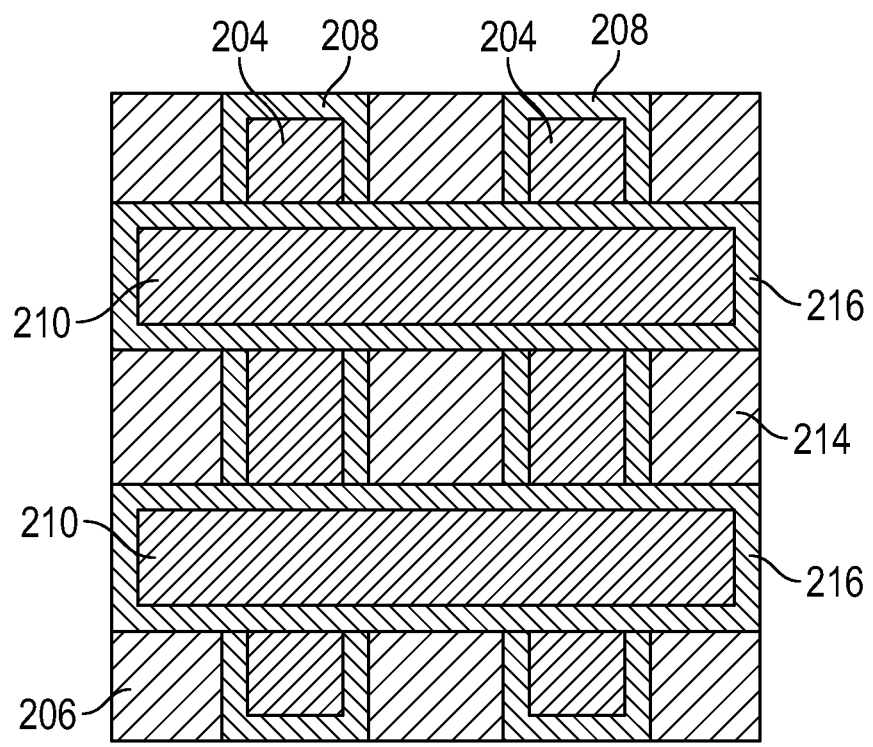
Figure 2I:
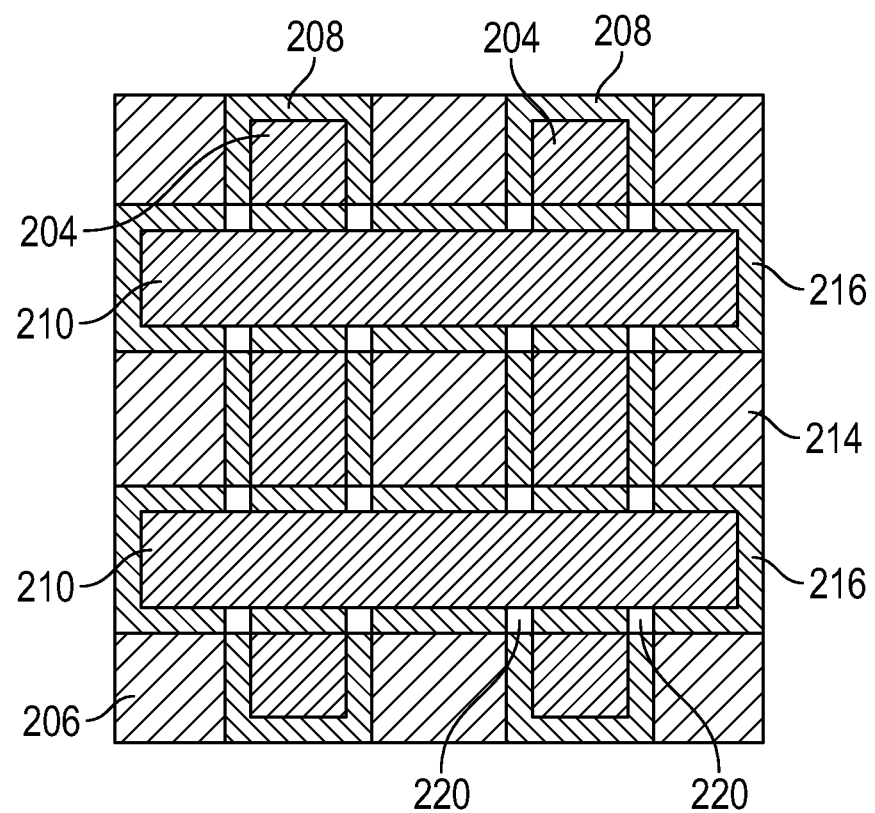

Referring to FIG. 1, it will be understood that in a variation of method 100, additional developing and etching may occur after diffusing the first solubility-shifting agents such that developing, and etching occur after each of diffusing the first and second solubility-shifting agents, respectively. Thus, in one or more embodiments, a first pattern of lines may be etched into the target layer on a substrate, followed by a second orthogonal pattern of lines, which is then etched into the substrate. For example, method 300 in accordance with such embodiments of the present disclosure is shown in and discussed with reference to FIG. 3.

Figure 3:
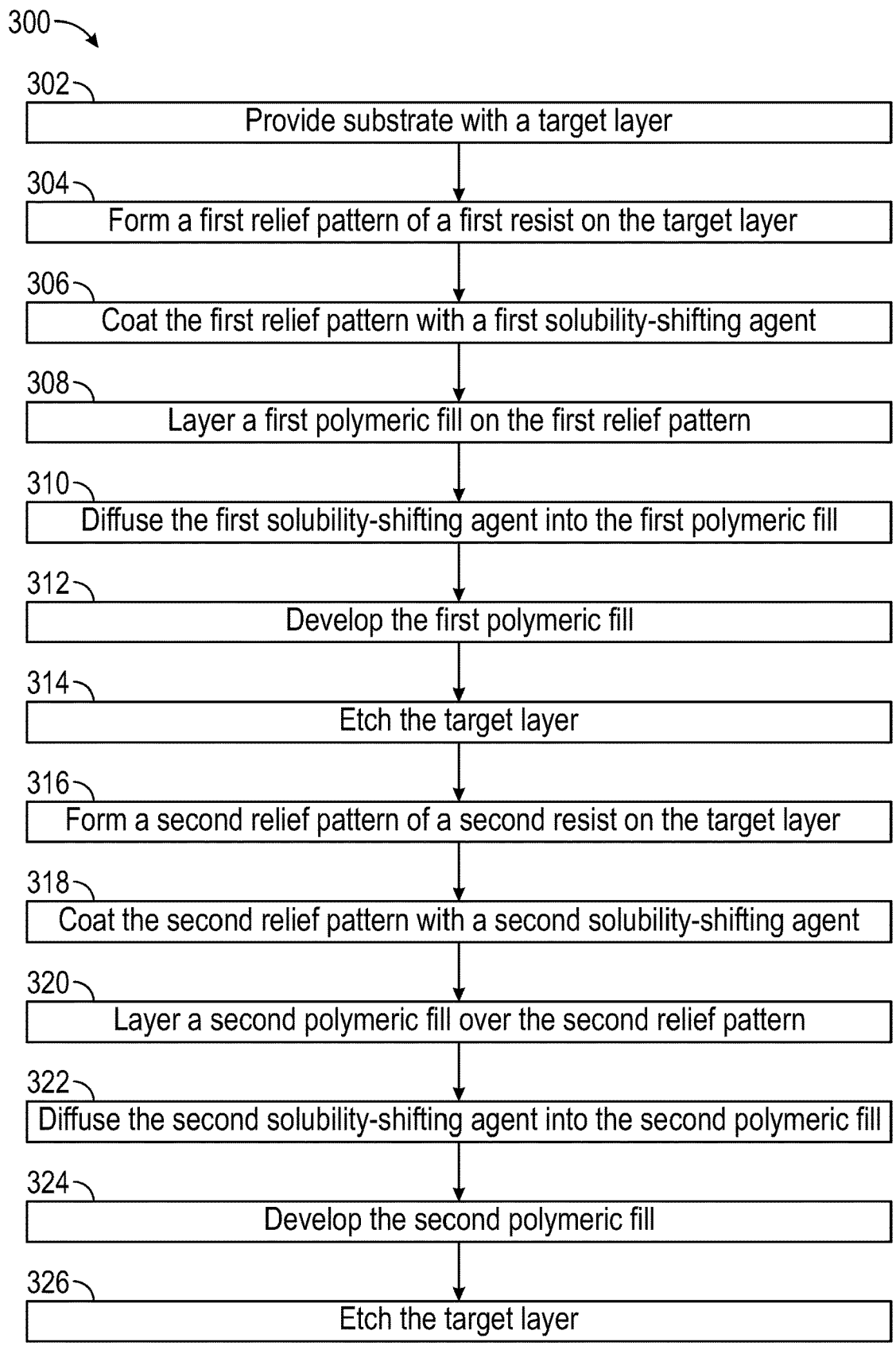
FIG. 3 is a block-flow diagram of a method in accordance with one or more embodiments of the present disclosure.

In FIG. 3, at block 302, a substrate is provided with a target layer. In one or more embodiments, the target layer is a hardmask layer. Then, a first relief pattern may be layered onto the target layer at block 304. The first relief pattern may include features separated by gaps, such that a portion of the target layer is exposed. The first relief pattern may include a first resist as previously described. Method 300 then includes, at block 306, coating the first relief pattern with a first solubility-shifting agent, and at block 308, layering a first polymeric fill on the substrate such that a planar layer is provided. The first solubility-shifting agent and the first polymeric fill are as previously described. At block 310, the first solubility-shifting agent is diffused into the first polymeric fill to provide a solubility-shifted region of the first polymeric fill. Diffusion of the first solubility-shifting agent may be carried out via a soft bake as previously described. The solubility shifted region may have a different solubility than the portion of the first polymeric fill that was not exposed to the solubility-shifting agent. Then, at block 312, the coated substrate may be developed such that the solubility-shifted region of the first polymeric fill dissolves and narrow trenches that expose the target layer are formed. In some embodiments, the development includes one or more of exposure to actinic radiation, thermal treatment, and development with a previously described specific developer. After developing the substrate and dissolving the solubility-shifted regions of the first polymeric fill, the target layer may be etched using the first polymeric fill and the first relief pattern as a combined etch mask to provide a first pattern of lines (block 314).

Subsequently, at block 316 of method 300, a second relief pattern including a second resist is provided on the target layer. The second resist is as previously described. The second relief pattern may include features separated by gaps, where the features are formed orthogonally to the first pattern of lines. At block 318, the second relief pattern is coated with a second solubility shifting agent, as previously described. Then, at block 320, a second polymeric fill is deposited onto the substrate such that it fills any gaps of the second relief pattern where the target layer is exposed. The second polymeric fill is as described above. In method 300, at block 322, the second solubility-shifting agent is diffused into the second polymeric fills to provide a solubility-shifted region as previously described. The solubility shifted region may have a different solubility than the portion of the second polymeric fill that was not exposed to the solubility-shifting agent. Then, at block 324, the substrate is developed such that the solubility-shifted region of the second polymeric fill dissolves and narrow trenches that expose the target layer are formed. Trenches from the second layer of resist (i.e., the second polymeric fill and the second relief pattern) may cross trenches from the first layer of resist (i.e., the first polymeric fill and the first relief pattern). As described above, various angles of crossing can be used (90° and 60°, among others) relative to the first trench lines. Finally, at block 326, the pattern defined by the second polymeric film and the second polymeric fill is selectively etched into the target layer. Such etching method may avoid etching thin regions and ensure the etch is continued until stopping on a hardmask etch stop layer.

Figure 4:
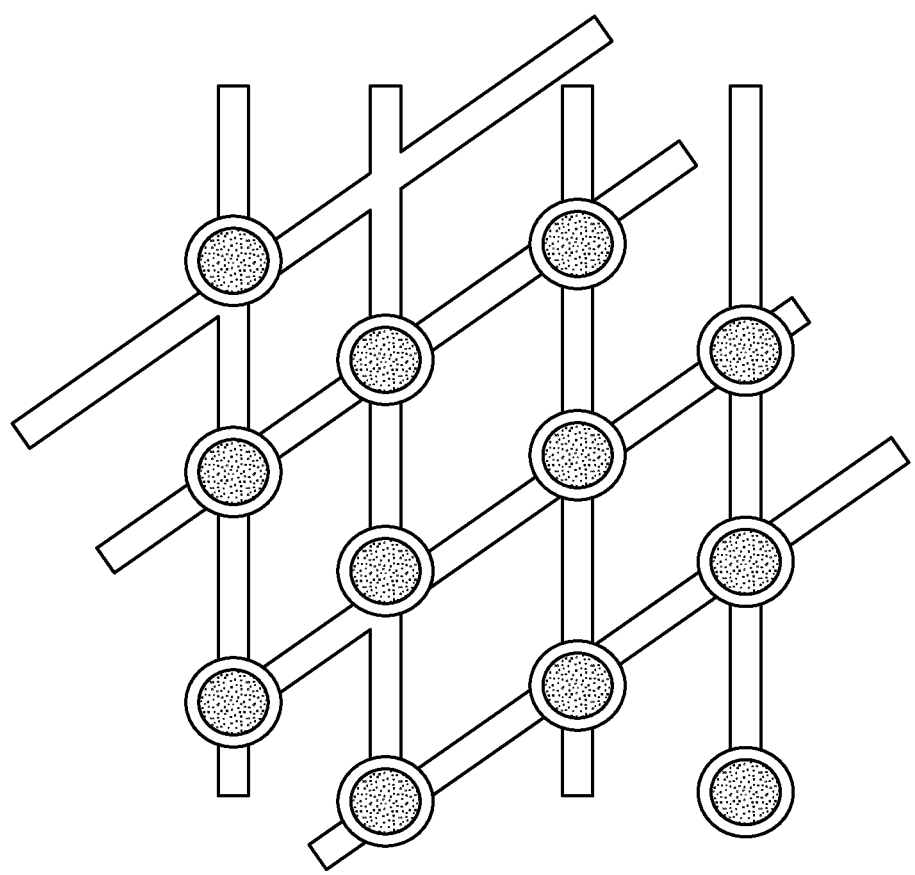
FIG. 4 is an exemplary schematic depiction of pattern produced using a method in accordance with one or more embodiments of the present disclosure.

As an alternative, the last etch step can be specific to the existing thin regions, although throughput will be reduced. Methods disclosed herein may include any shape, depending on the overlap regions. For instance, a fully dense array of contacts may be provided by overlapping two or three different arrays, giving a maximally dense final array. FIG. 4 shows a possible shape that may be produced according to methods of one or more embodiments.

Method 100 represents one possible embodiment and is not intended to limit the scope of the present invention. As will be appreciated by one of ordinary skill in the art, the present invention may encompass various alternative methods, such as, for example, methods in which the first solubility-shifting agent is diffused into the first resist rather than the first polymeric fill and the second solubility-shifting agent is diffused into the second resist rather than the second polymeric fill. In such alternate embodiments, the components and techniques used in the methods may be as previously described with reference to method 100.

As mentioned above, in one or more embodiments, the first solubility-shifting agent is diffused into the first resist and the second solubility-shifting agent is diffused into the second resist. In such embodiments, a method may include initially forming a first relief pattern of a first resist and then coating the first resist with a first solubility-shifting agent. At this point, the first solubility-shifting agent may be diffused into the first resist a predetermined distance to provide a solubility-shifted region of the first resist. While diffusion of the first solubility-shifting agent may occur at a different point in such method and into a different component, diffusion of the solubility-shifting agent may be carried out as described above in method 100. After the first solubility-shifting agent is diffused into the first resist, the first polymeric fill may be deposited on the substrate. Then, a second relief pattern may be layered on the first relief pattern as previously described. A second solubility-shifting agent may then be coated over the second relief pattern and subsequently diffused into the second relief pattern. Diffusion of the second solubility-shifting agent may provide a solubility-shifted region or the second resist. Then, a second polymeric fill is then layered on the second relief pattern. Finally, the substrate is developed and etched as described with reference to method 100, where the solubility-shifted regions of the first and second resists are soluble in the specific developer.

Methods and systems of one or more embodiments, in relying on both chemical processes and diffusional properties, provide the unique ability to add control features to the input chemistry itself, and the process of measuring such chemistry.

Embodiments of the present disclosure may provide at least one of the following advantages. Methods in accordance with one or more embodiments provide the ability to etch high-density contact array patterns into substrates without requiring conventional and expensive lithography steps. Thus, methods in accordance with the present disclosure provide lower cost high-density contact arrays, such as memory devices. Lithographic control is preserved, which allows patterning regions in the periphery of a contact array to be formed. Accordingly, a track-based, or in-resist, anti-spacer technology for contact arrays is enabled by methods disclosed herein, thus obviating the need for atomic layer deposition (ALD) and etch technology.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed:

1. A method of microfabrication comprising: providing a substrate having a target layer formed thereon; forming a first relief pattern on the substrate, wherein the first relief pattern comprises a first resist; coating the first relief pattern with a first solubility-shifting agent; layering a first polymeric fill on the first relief pattern; diffusing the first solubility-shifting agent a predetermined distance into the first polymeric fill to provide a solubility-shifted region of the first polymeric fill, wherein the solubility-shifted region of the first polymeric fill borders the first relief pattern and wherein the solubility-shifted region of the first polymeric fill is soluble in a first developer; forming a second relief pattern over the first relief pattern, wherein the second relief pattern comprises a second resist; coating the second relief pattern with a second solubility-shifting agent;

layering a second polymeric fill on the second relief pattern; diffusing the second solubility-shifting a predetermined distance into the second polymeric fill to provide a solubility-shifted region of the second polymeric fill, wherein the solubility-shifted region of the second polymeric fill borders the second relief pattern and wherein the solubility-shifted region of the second polymeric fill is soluble in a second developer; developing the first polymeric fill and the second polymeric fill such that the solubility-shifted region of the first polymeric fill and the solubility-shifted region of the second polymeric fill are dissolved providing gaps between the first relief pattern, the first polymeric fill, the second relief pattern, and the second polymeric fill where a portion of the target layer is exposed; and etching the target layer using the first relief pattern, the first polymeric fill, the second relief pattern, and the second polymeric fill as a combined etch mask.

2. The method of claim 1, wherein the first relief pattern comprises features separated by gaps between the features, wherein the features comprise the first resist.

3. The method of claim 1, wherein the first polymeric fill fills the gaps of the first relief pattern.

4. The method of claim 1, wherein the second relief pattern comprises features separated by gaps between the features, wherein the features comprise the second resist.

5. The method of claim 1, wherein the second polymeric fill fills the gaps of the second relief pattern.

6. The method of claim 1, wherein providing the first relief pattern on the target layer comprises:
forming a first pattern of lines on the target layer;
depositing a layer of the first resist over the first pattern of lines;
exposing the first resist to a pattern of actinic radiation and developing the first resist such that the first relief pattern is formed over the first pattern of lines.

7. The method of claim 1, wherein the first solubility-shifting agent is selected from the group consisting of an acid generator, an acid, a matrix polymer, and a solvent.

8. The method of claim 1, wherein the second solubility-shifting agent is selected from the group consisting of an acid generator, an acid, a matrix polymer, and a solvent.

9. The method of claim 1, wherein the first resist comprises a polymer made from monomers selected from the group consisting of styrene, p-hydroxystyrene, methacrylate, norbornene, and combinations thereof.

10. The method of claim 1, wherein the second resist comprises a polymer made from monomers selected from the group consisting of styrene, p-hydroxystyrene, methacrylate, norbornene, and combinations thereof.

11. A method of microfabrication comprising:
providing a substrate having a target layer formed thereon;
forming a first relief pattern on the substrate, wherein the first relief pattern comprises a first resist;
coating the first relief pattern with a first solubility-shifting agent;
layering a first polymeric fill on the first relief pattern;
diffusing the first solubility-shifting agent a predetermined distance into the first polymeric fill to provide a solubility-shifted region of the first polymeric fill, wherein the solubility-shifted region of the first polymeric fill borders the first relief pattern;
developing the first polymeric fill such that the solubility-shifted region of the first polymeric fill is dissolved, providing gaps between the first relief pattern and the first polymeric fill where a portion of the target layer is exposed;
etching the target layer using the first relief pattern and the first polymeric fill as a combined etch mask;
forming a second relief pattern on the substrate wherein the second relief pattern comprises a second resist;
coating the second relief pattern with a second solubility-shifting agent;
layering a second polymeric fill on the second relief pattern;
diffusing the second solubility-shifting a predetermined distance into the second polymeric fill to provide a solubility-shifted region of the second polymeric fill, wherein the solubility-shifted region of the second polymeric fill borders the second relief pattern;
developing the second polymeric fill such that the solubility-shifted region of the second polymeric fill is dissolved providing gaps between the second relief pattern and the second polymeric fill where a portion of the target layer is exposed; and
etching the target layer of the substrate using the second relief pattern and the second polymeric fill as a combined etch mask.

12. The method of claim 11, wherein the first relief pattern comprises features separated by gaps between the features, wherein the features comprise the first resist.

13. The method of claim 11, wherein the first polymeric fill fills the gaps of the first relief pattern.

14. The method of claim 11, wherein the second relief pattern comprises features separated by gaps between the features, wherein the features comprise the second resist.

15. The method of claim 11, wherein the second polymeric fill fills the gaps of the second relief pattern.

16. The method of claim 11, wherein providing the first relief pattern on the target layer comprises:

forming a first pattern of lines on the target layer;
depositing a layer of the first resist over the first pattern of lines;
exposing the first resist to a pattern of actinic radiation and developing the first resist such that the first relief pattern is formed over the first pattern of lines.

17. The method of claim 11, wherein the first solubility-shifting agent is selected from the group consisting of acid generators, acids, matrix polymers, and solvents.

18. The method of claim 11, wherein the second solubility-shifting agent is selected from the group consisting of acid generators, acids, matrix polymers, and solvents.

19. The method of claim 11, wherein the first resist comprises a polymer made from monomers selected from the group consisting of styrene, p-hydroxystyrene, methacrylate, norbornene, and combinations thereof.

20. The method of claim 11, wherein the second resist comprises a polymer made from monomers selected from the group consisting of styrene, p-hydroxystyrene, methacrylate, norbornene, and combinations thereof.

* * * * *